US009251996B2

(12) United States Patent
Kawanishi et al.

(10) Patent No.: US 9,251,996 B2
(45) Date of Patent: Feb. 2, 2016

(54) CHARGED PARTICLE BEAM DEVICE, POSITION ADJUSTING METHOD FOR DIAPHRAGM, AND DIAPHRAGM POSITION ADJUSTING JIG

(71) Applicant: Hitachi High-Technologies Corporation, Minato-ku, Tokyo (JP)

(72) Inventors: Shinsuke Kawanishi, Tokyo (JP); Yusuke Ominami, Tokyo (JP); Masahiko Ajima, Tokyo (JP); Hiroyuki Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/431,061

(22) PCT Filed: Sep. 25, 2013

(86) PCT No.: PCT/JP2013/075804
§ 371 (c)(1),
(2) Date: Mar. 25, 2015

(87) PCT Pub. No.: WO2014/054477
PCT Pub. Date: Apr. 10, 2014

(65) Prior Publication Data
US 2015/0228449 A1    Aug. 13, 2015

(30) Foreign Application Priority Data

Oct. 1, 2012  (JP) ................... 2012-219018

(51) Int. Cl.
*H01J 37/20* (2006.01)
*H01J 37/16* (2006.01)
*H01J 37/18* (2006.01)

(52) U.S. Cl.
CPC .............. *H01J 37/20* (2013.01); *H01J 37/16* (2013.01); *H01J 37/18* (2013.01); *H01J 2237/164* (2013.01); *H01J 2237/2608* (2013.01)

(58) Field of Classification Search
CPC ........... H01J 37/20; H01J 37/26; H01J 37/28; H01J 2237/164; H01J 2237/2608
See application file for complete search history.

(56) References Cited

U.S. PATENT DOCUMENTS

| 5,412,211 A | 5/1995 | Knowles |
| 2009/0166536 A1 | 7/2009 | Suga et al. |

(Continued)

FOREIGN PATENT DOCUMENTS

| JP | 64-35654 U | 3/1989 |
| JP | 9-320504 A | 12/1997 |
| JP | 2003-229083 A | 8/2003 |

(Continued)

OTHER PUBLICATIONS

International Search Report (PCT/ISA/210) dated Oct. 22, 2013 with English translation (five pages).

*Primary Examiner* — Jack Berman
*Assistant Examiner* — Eliza Osenbaugh-Stewar
(74) *Attorney, Agent, or Firm* — Crowell & Moring LLP

(57) ABSTRACT

In a charged particle beam device that performs observation of a sample under a gas environment in atmospheric pressure or pressure substantially equal to the atmospheric pressure, a diaphragm that separates an atmospheric pressure space, in which the sample is placed, and a vacuum space in an interior of an electron optical lens barrel is made very thin in order to allow an electron beam to transmit therethrough and damaged with a high possibility. Although at the time of replacing the diaphragm, it is necessary to adjust a position of a diaphragm, it is impossible to easily perform the adjustment of the position of the diaphragm by a conventional method. In a charged particle beam device with a configuration in which a thin film that separates a vacuum environment and an atmospheric environment or a gas environment is employed, a detachable diaphragm that partitions a space, in which a sample is placed, in such a manner that pressure in the space in which the sample is placed is maintained at a level larger than pressure in an interior of a housing, and that allows transmission or passage of a primary charged particle beam therethrough, and a movable member that can move the diaphragm in a state where the pressure in the space, in which the sample is placed, and the pressure in the interior of the housing are maintained as they are, are provided.

18 Claims, 19 Drawing Sheets

(56) References Cited

U.S. PATENT DOCUMENTS

| | | | |
|---|---|---|---|
| 2010/0096549 A1* | 4/2010 | Nishiyama | G01N 23/2251 250/307 |
| 2011/0168889 A1* | 7/2011 | Shachal | G01N 23/22 250/307 |
| 2013/0313430 A1 | 11/2013 | Ominami et al. | |
| 2014/0151553 A1* | 6/2014 | Ominami | H01J 37/18 250/307 |
| 2015/0206705 A1* | 7/2015 | Sakuma | H01J 37/20 250/453.11 |

FOREIGN PATENT DOCUMENTS

| | | |
|---|---|---|
| JP | 2006-147430 A | 6/2006 |
| JP | 2009-158222 A | 7/2009 |
| JP | 2012-160267 A | 8/2012 |
| JP | 2013-69443 A | 4/2013 |
| WO | WO 2013/042425 A1 | 3/2013 |

* cited by examiner

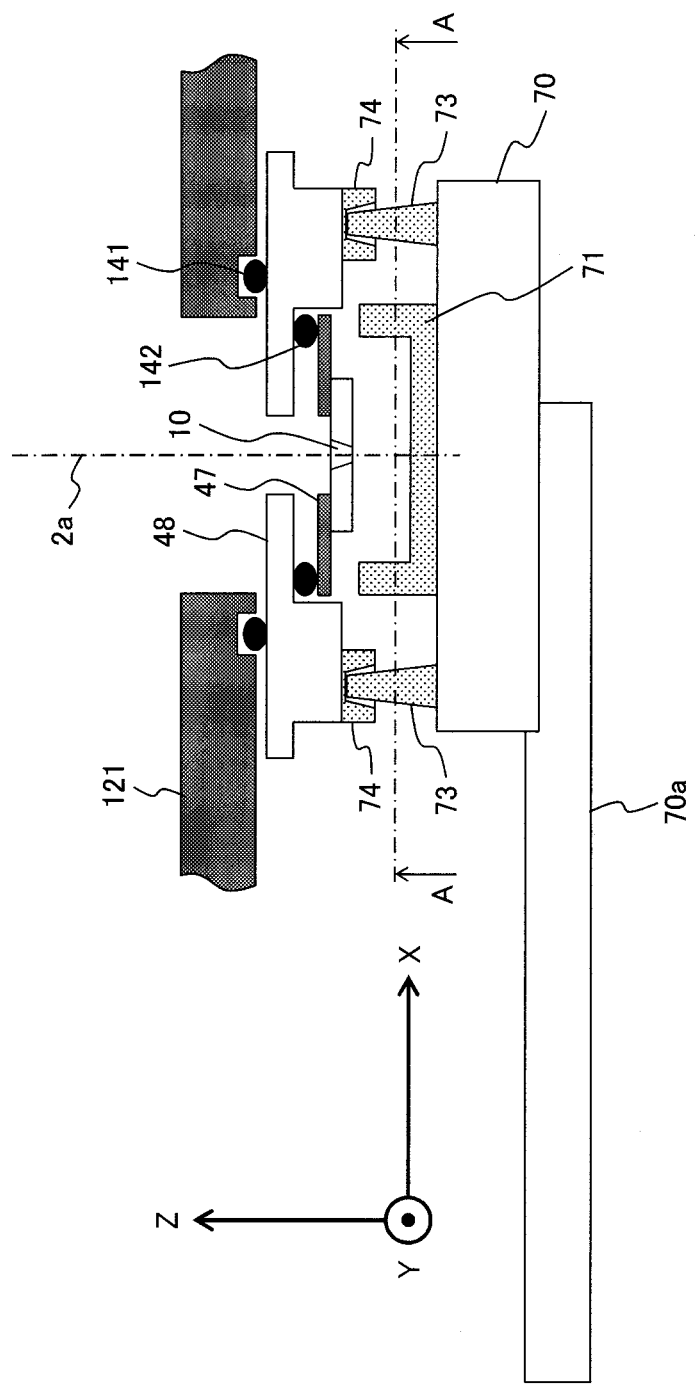

FIG. 13
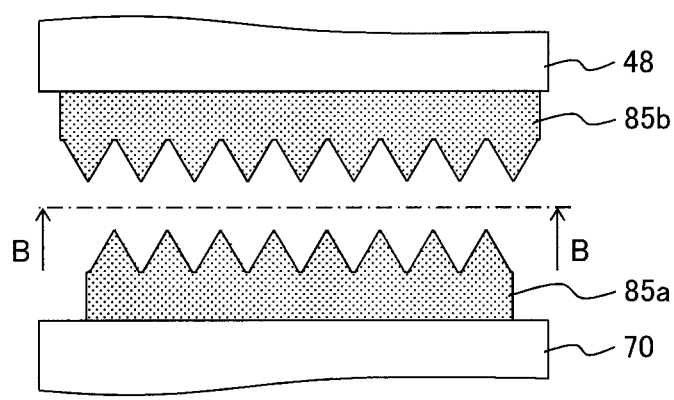
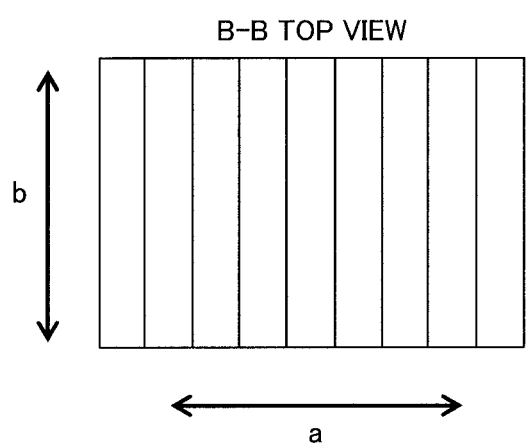
B-B TOP VIEW

CHARGED PARTICLE BEAM DEVICE, POSITION ADJUSTING METHOD FOR DIAPHRAGM, AND DIAPHRAGM POSITION ADJUSTING JIG

TECHNICAL FIELD

The present invention relates to a charged particle beam device which can observe a sample in a predetermined gas environment in an atmospheric pressure state, a state of being slightly pressurized relative to atmospheric pressure, or a negative pressure state.

BACKGROUND ART

A scanning electron microscope (SEM), a transmission electron microscope (TEM), etc. are used in order to observe a micro region of an object. Generally, in these devices, housings in which samples are arranged are vacuum-evacuated, sample environments are brought into vacuum states, and the samples are observed. However, biochemistry samples, liquid samples, etc. are damaged or changed in states by vacuum. On the other hand, demand for observation of such samples by the electron microscopes is greatly raised. In recent years, SEM devices capable of observing observation target samples under the atmospheric pressure, sample holding devices, etc. have been developed.

In principle, these devices are in principle configured to provide a diaphragm or a micro through-hole, through which an electron beam can pass, between an electron optical system and a sample, to thereby separate a space in vacuum state from a space in atmospheric pressure state. Any of the devices are common in point of providing the diaphragm between the sample and electron optical system.

For example, Patent Document 1 discloses an SEM in which an electron source side of an electron optical lens barrel is arranged downward and an objective lens side is arranged upward, and a diaphragm through which an electron beam can pass is provided via an O-ring on an electron-beam exit aperture at an end of the electron optical lens barrel.

According to the invention described in the Patent Document, an observation target sample is carried directly on the diaphragm, a primary electron beam is irradiated onto the lower surface of the sample, a reflected electron or a secondary electron is detected, and SEM observation is performed. The sample is held in a space defined by an annular member, installed around the diaphragm, and the diaphragm, and further is filled with liquid such as water.

CITATION LIST

Patent Document

Patent Document 1: Japanese Patent Application Laid-Open No. 2009-158222 A (US 2009/0166536 A)

SUMMARY OF INVENTION

Technical Problem

Any of the conventional charged particle beam devices are devices that are manufactured exclusively for observation under atmospheric pressure or under gas environment whose pressure is substantially equal to atmospheric pressure. A device which can easily perform observation under the atmospheric pressure or under the gas environment whose pressure is substantially equal to the atmospheric pressure, by using a general high-vacuum charged particle microscope does not exit.

For example, the SEM described in the Patent Document 1 is a structurally very special device, and cannot execute SEM observation in an ordinary high vacuum environment.

Moreover, the diaphragm that separates an atmospheric space in which the sample is arranged, and a vacuum space within the electron optical lens barrel is made very thin in order to allow passage of an electron beam therethrough, and will be damaged with quite a high probability. At the time of replacing the diaphragm, the position of new diaphragm is required to be adjusted. However, according to the conventional method, it is impossible to easily perform the adjustment of the position of the diaphragm.

The present invention has been made in view of the foregoing problems, and it is an object of the present invention to provide a charged particle beam device with which a sample can be observed in an atmospheric environment or a gas environment without significantly changing the configuration of the conventional high vacuum charged particle microscope, and with which the diaphragm position adjusting operation can be easily performed.

Solution to Problem

In order to solve the above-mentioned problems, for example, a configuration defined in claims is employed.

The instant application is directed to an invention which includes a plurality of means for solving the problems. If a charged particle beam device that comprises a charged particle optical lens barrel irradiating a primary charged particle beam onto a sample and a vacuum pump is taken, the charged particle beam device is characterized in that the charged particle beam device includes a housing forming a part of the charged particle beam device and having an interior adapted to be subjected to vacuum evacuation by the vacuum pump, a detachable diaphragm partitioning a space, in which the sample is placed, in such a manner to maintain pressure in the space at a level larger than pressure in the interior of the housing, and allowing passage or transmission of the primary charged particle beam therethrough, and a movable member capable of moving the diaphragm while maintaining the pressure in the space, in which the sample is placed, and the pressure in the interior of the housing.

Advantageous Effects of Invention

According to the present invention, it is possible to provide a charged particle beam device with which a sample can be observed in an atmospheric environment or a gas environment without significantly changing the configuration of the conventional high vacuum charged particle microscope, and with which the diaphragm position adjusting operation can be easily performed.

Other objects, configurations, and advantages, except for the foregoing will become apparent from the following description of embodiments.

BRIEF DESCRIPTION OF DRAWINGS

FIG. 3 is a view showing an example of a configuration in which pins and holes are used as fastening members.

FIG. 13 is a view showing a fastening direction by the fastening members.

DESCRIPTION OF PREFERRED EMBODIMENTS

Respective embodiments will be explained hereinafter with reference to the drawings.

As examples of a charged particle beam device, charged particle beam microscopes will be explained hereinafter. Incidentally, they are just embodiments of the present invention, and the present invention is not limited to embodiments explained hereinafter. The present invention is also applicable to a scanning electron microscope, a scanning ion microscope, a composite device including them and a sample processing device, or an analyzing/inspecting device to which they are applied.

Moreover, in the description, "atmospheric pressure" is an atmospheric environment or a predetermined gas environment, and means a pressure environment in an atmospheric pressure state, a slightly negative pressure state, or a pressurized state. Concretely, it is in a range of about $10^5$Pa (atmospheric pressure) to about $10^3$Pa.

First Embodiment

Figure 1:
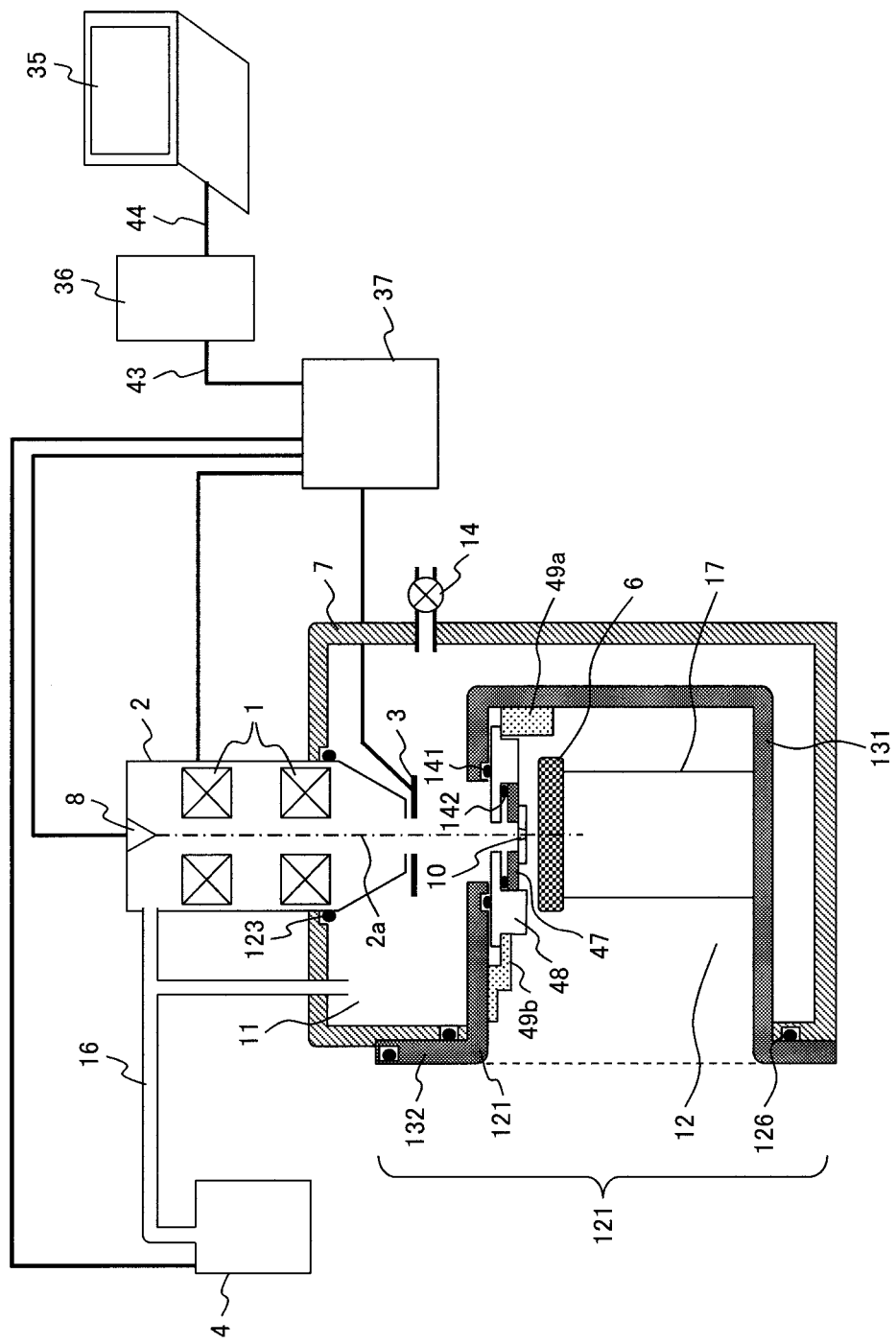
FIG. 1 is an overall configuration view of a charged particle microscope of a first embodiment.

This embodiment will describe a fundamental embodiment. FIG. 1 is an overall configuration view of a charged particle microscope of this embodiment. The charged particle microscope shown in FIG. 1 mainly includes a charged particle optical lens barrel 2, a first housing 7 (hereinafter also referred to as a vacuum chamber) supporting the charged particle optical lens barrel on a device installation surface thereof, a second housing 121 (hereinafter also referred to as an attachment) inserted in the first housing 7 and then used, and a control system controlling them. At the time of using the charged particle microscope, the charged particle optical lens barrel 2 and the interior of the first housing are subjected to vacuum evacuation by a vacuum pump 4. Start and stop operation of the vacuum pump 4 is also controlled by the control system. Although FIG. 1 shows a single vacuum pump 4, two or more vacuum pumps may be provided.

The charged particle optical lens barrel 2 comprises a charged particle source 8 generating charged particle beams, and constituent elements, such as lenses 1, which focus and introduce the generated charged particle beams to a lens barrel lower portion, and scan a sample 6 by employing primary charged particle beams. The charged particle optical lens barrel 2 is installed so as to protrude into the interior of the first housing 7 and fixed to the first housing 7 through a vacuum sealing member 123. At an end portion of the charged particle optical lens barrel 2, a detector 3 which detects secondary particles (secondary electrons or backscattered electron, secondary charged particles such as reflected ions, or photons, X-rays, etc.) that are obtained by irradiation of the aforementioned primary charged particle beams is arranged. In the example of the configuration which is shown in FIG. 1, the detector 3 is provided in the interior of the first housing 7. However, it may be arranged in the charged particle optical lens barrel 2 or in the interior of the second housing 121.

The charged particle microscope of this embodiment includes, as the control system, a computer 35 that a user of the device uses, an upper-level control unit 36 that is connected to the computer 35 and performs communication, and a lower-level control unit 37 that performs controls of a vacuum evacuation system, charged particle optical system, etc. according to a command transmitted from the upper-level control unit 36. The computer 35 includes a monitor that displays a graphical user interface (GUI) of the device, and an input means for the graphical user interface, such as a keyboard and a mouse. The upper-level control unit 36 and the lower-level control unit 37 are connected with a communication line 43, while the upper-level control unit 36 and the computer 35 are connected with a communication line 44.

The lower-level control unit 37 is a section which transmits and receives control signals for controlling the vacuum pump 4, the charged particle source 8, the optical lenses 1, and the like, and further converts an output signal of the detector 3 into a digital image signal and transmits it to the upper-level control unit 36. Although the output signal from the detector 3 is connected to the lower-level control unit 37 in FIG. 1, an amplifier such as a preamplifier may also be interposed therebetween. The upper-level control unit 36 and the lower-level control unit 37 may include a mixture of analog circuits, digital circuits, and the like. In addition, the upper-level control unit 36 and the lower-level control unit 37 may be a single, integrated unit. Incidentally, the configuration of the control system shown in FIG. 1 is merely one example, and variations of the control units, valve, vacuum pump, wires for communication, and the like all fall into the category of the charged particle beam microscope of this embodiment as far as the functions intended by this embodiment are satisfied.

A vacuum pipe 16 connected at one end thereof to the vacuum pump 4 is connected to the first housing 7. Thus, the interior of the first housing 7 can be maintained in a vacuum state. At the same time, the first housing 7 has a leak valve 14 for exposing the interior of the housing to the atmosphere, thus making it possible to expose the interior of the first housing 7 to the atmosphere in maintenance. The leak valve 14 may be either provided or not, and two or more leak valves 14 may also be provided. Moreover, the arrangement position of the leak valve 14 on the first housing 7 is not limited to the position shown in FIG. 1, and the leak valve 14 may be provided at another position on the first housing 7. Further, the first housing 7 has an opening at a side face thereof, and the second housing 121 is inserted in the first housing through the opening.

The second housing 121 includes a main body portion 131, that is cuboid in shape, and a mating portion 132. As will be described hereinafter, at least one of side faces of the cuboid shape of the main body portion 131 forms an open surface 9. Faces other than a face of the side surfaces of the cuboid shape of the main body portion 131 on which a diaphragm holding member 47 is installed may be formed by walls of the second housing 121. The second housing 121 itself may not have walls and, in a state of being incorporated into the first housing 7, may be formed by side walls of the first housing 7. The position of the second housing 121 is fixed at the side face or inner wall surface of the first housing 7 or the charged particle optical lens barrel. The main body portion 131 is inserted into the first housing 7 through the above-mentioned opening and, in the state of being incorporated into the first housing 7, has a function of storing the sample 6 that is a target to be observed. The mating portion 132 forms a mating face with an outer wall face of the first housing 7 on the side face side, at which the opening of the first housing 7 is provided, and is fixed, through a vacuum sealing member 126, to the outer wall face on the side face side. Accordingly, the second housing 121 is entirely fitted into the first housing 7. The aforementioned opening can be most simply manufactured by using an opening that a vacuum sample chamber of the charged particle microscope originally has for carrying in or out the sample. That is, if the second housing 121 is manufactured in keeping with the size of the hole that is originally provided, and the vacuum sealing member 126 is attached to a circumferential area around the hole, alternations that should be made to the device can be suppressed to the minimum. Moreover, the second housing 121 can be detached from the first housing 7.

The main body portion 131 has on the upper face side thereof a thin film 10 at a position where the thin film 10 is located immediately below the charged particle optical lens barrel 2 when the second housing 121 is entirely fitted into the first housing 7. This thin film 10 allows primary charged particle beams emitted from the lower end of the charged particle optical lens barrel 2 to transmit or pass therethrough, so that the primary charged particle beams pass through the thin film 10 and finally reach the sample 6.

By the charged particle beams reaching the sample 6, secondary particles such as backscattered charged particles or transmitted charged particles are emitted from the interior or surface of the sample. The secondary particles are detected by the detector 3. The detector 3 is provided on the sample surface side onto which the primary charged particle beams are irradiated, so that information on the sample face can be obtained. The detector 3 is a detecting element that can detect charged particles that drift with energy in a range of from several keV to several ten keV. Moreover, this detecting element may have an amplifier means. It is preferable that the detecting element is thin and flat from a request for the configuration of the device. The detecting element is, for example, a semiconductor detector formed of a semiconductor material such as silicone, or a scintillator capable of converting a charged particle signal into light in a glass surface or interior.

In conventional techniques, a sample is held within a diaphragm interior filled with liquid and, observation at atmospheric pressure is executed once, the sample become wet, so that it would be very difficult to observe a sample in the same state in both of an atmospheric environment and a high vacuum environment. Moreover, as the diaphragm is always in contact with the liquid, there is a problem in that the diaphragm will be damaged with a considerably high possibility. On the other hand, according to the system of this embodiment, the sample 6 is arranged in a non-contacted state with the diaphragm 10, so that it is possible to observe the sample in either under high vacuum or under atmospheric pressure, without changing the state of the sample. Moreover, the sample is not carried on the diaphragm, so that it is possible to reduce a possibility that the diaphragm will be damaged by the sample.

When the charged particle beam is an electron beam, the thin film 10 is required to have a thickness that allows the electron beam to transmit therethrough, typically, about several nm to 20 µm or less. Instead of the thin film, an aperture member with a through-hole that allows primary charged particle beams to pass therethrough may be used. A hole diameter in that case is desirably less than or equal to an area of about 1 mm$^2$ from a request that differential evacuation should be conducted using realistic vacuum pumps. When the charged particle beam is an ion beam, it is difficult for the ion beam to transmit through the thin film without damaging the thin film, so that an aperture with an area that is less than or equal to about 1 mm$^2$ is used. A chain line in FIG. 1 indicates the optical axis of the primary charged particle beam. The charged particle optical lens barrel 2 and the diaphragm 10 are adjusted so as to be arranged on the same axis as the optical axis of the primary charged particle beam. A distance between the sample 6 and the diaphragm 10 is adjusted by providing a specimen support with an appropriate height.

As shown in FIG. 1, a side face of the second housing 121 is an open face that communicates with an atmospheric space through a face that has a size allowing at least the sample to be carried in or out of the second housing 121, and the sample 6 that is stored in the interior of the second housing 121 (on the right side of the dotted line in FIG. 1; hereinafter, a second space) is placed in an atmospheric pressure state during observation. Incidentally, although only one open face 9 is shown in FIG. 1 because FIG. 1 is a sectional view of the device taken in a direction parallel to the optical axis, the open face 9 of the second housing 121 is not limited to the only one face as far as the second housing is sealed with side faces of the first housing in a front-back direction of a paper surface of FIG. 1. In the state where the second housing 121 is incorporated into the first housing 7, at least one or more open faces may exist. On the other hand, the vacuum pump 4 is connected to the first housing 7, and a closed space (hereinafter, a first space) which is defined by the inner wall face of the first housing 7, the outer wall face of the second housing, and the thin film 10 can be subjected to vacuum evacuation. Accordingly, in this embodiment, while the first space 11 is maintained at high vacuum by the diaphragm 10, the second space 12 is maintained at gas environment whose pressure is atmospheric pressure or is substantially equal to the atmospheric pressure, so that during device operation, the charged particle optical lens barrel 2 and the detector 3 can be maintained in a vacuum state and that the sample 6 can be maintained at atmospheric pressure.

In a conventional technique such as an environmental cell that can locally maintain atmospheric environment, although observation at atmospheric pressure/gas environment can be executed, only sample which has a size that allows the sample to be inserted into the cell can be observed. Accordingly, there is a problem in that observation of a large-sized sample at atmospheric pressure/gas environment cannot be executed. Moreover, in the case of the environmental cell, when a different sample is observed, the environmental cell is removed from the vacuum sample chamber of the SEM, and the sample is replaced with the different sample, and the different sample must be carried in the vacuum sample chamber. Accordingly, there is a problem in that it is troublesome to replace the sample. On the other hand, according to the system of this embodiment, one side face of the second housing 121 is opened, and the sample 6 is carried in the second space 12 that is a wide atmospheric space, so that even a large-sized sample such as a semiconductor wafer can be observed under atmospheric pressure. Particularly, the second housing of this embodiment is of a type inserted from the side face of the sample chamber, so that the second housing is easy to be increased in size. Therefore, even a large-sized sample that cannot be enclosed in the environmental cell can be observed. Moreover, the second housing 121 has the open face, so that the sample can be moved between the inside and outside of the second space 12 under observation and the replacement of the sample can be easily performed.

The diaphragm 10 is detachably fixed, through the diaphragm holding member 47, onto an upper face side of the main body portion 131 of the second housing, more concretely, onto an under face side of a ceiling plate of the second housing. Although the diaphragm 10 is fixed to the diaphragm holding member 47 so as to provide a vacuum seal, a vacuum sealing member such as an O-ring may be employed, or the fixing of the diaphragm may be performed by an organic material such as an adhesive, or a tape or the like. The diaphragm holding member 47 is detachably fixed, through a movable member described below and the vacuum sealing member, onto the under face side of the ceiling plate of the second housing 121. The thin film 10 is very thin, such as several nm to several ten μm or less (more concretely, about 20 μm or less) in thickness, for a demand for allowing an electron beam to transmit through the thin film, so that it may be deteriorated with passage of time or damaged in the preparation of observation. Moreover, since the diaphragm 10 is thin, it is very difficult to directly handle the thin film. According to this embodiment, the thin film 10 is not directly handled and can be handled through the diaphragm holding member 47, whereby the handling of the diaphragm 10 (particularly, replacement) is made very easy. That is, if the diaphragm 10 is damaged, the diaphragm holding member 47 and all may be replaced. Even if the diaphragm 10 must be directly replaced, the diaphragm holding member 47 is taken out of the device and the replacement of the diaphragm 10 can be performed outside the device. Incidentally, it goes without saying that an aperture member having a hole with an area of about 1 mm$^2$ or less can be used instead of the diaphragm.

In this configuration, a movable section that is movable relative to a plane vertical to a primary charged particle beam and holds the diaphragm is provided. The movable section comprises the diaphragm holding member 47 holding the diaphragm, and a movable member 48. The movable member 48 is attached to the second housing 121 through a vacuum sealing member 141. Moreover, the diaphragm holding member 47 is attached to the movable member 48 through a vacuum sealing member 142. The movable member 48 is attached so as to be capable of moving on movable planes (X-Y planes) relative to a charged particle optical lens barrel-optical axis 2a, while maintaining the interior of the first housing 7 in vacuum and maintaining the second space 12 in atmospheric pressure. By differential pressure between the first space 11 and the second space 12, the movable member 48 is pressed against the inner wall side of the second housing 121 and held by the vacuum sealing member 141. In this state, the movable member 48 left in contact with the vacuum sealing member 141 is slid, whereby the movable member 48 can be moved on the X-Y planes while maintaining the differential pressure between the first space and the second space. Incidentally, the movable member 48 may be held by rails or roller guides (not shown) as well as the differential pressure between atmosphere and vacuum. Support members 49a, 49b which hold the movable member 48 in such a manner that the movable member 48 does not fall down at the time of atmosphere release may be provided. Moreover, the movable member 48 and the diaphragm holding member 47 may be configured as one piece.

The diaphragm is a very thin film for the demand for allowing transmission of a charged particle, so that the diaphragm must be made very small in area (for example, 1 mm$^2$ or less) due to the necessity of withstanding pressure toward a vacuum side. Moreover, it is conceivable that, when the attaching of the thin film holding member 47 including the diaphragm 10 is performed, the diaphragm 10 is installed with a center thereof being misaligned from the charged particle optical lens barrel-optical axis 2a. In order to irradiate charged particle beams to the sample and perform the observation of the sample, the position of the diaphragm 10 is required to be adjusted in such a manner that the center of the diaphragm 10 is positioned on the charged particle optical lens barrel-optical axis 2a. Therefore, it is critical that, after the diaphragm 10 and the like are attached, adjusting of the position of the diaphragm 10 is performed while observing the diaphragm 10 and the diaphragm holding member 47 by the charged particle microscope. In the case where the aperture member is used, similarly, the position of the aperture member is required to be adjusted since the area of the opening of the aperture member is made small due to a demand for performing differential evacuation.

Moreover, there is a possibility that the diaphragm 10 will be subjected to contamination and damage by a charged particle beam. In this case, the replacement of the diaphragm 10 is required at a certain frequency. Since misalignment between the diaphragm 10 and the charged particle optical lens barrel is occurred, every time the diaphragm is replaced, the adjustment of the position of the diaphragm is required to be performed.

Figure 2:
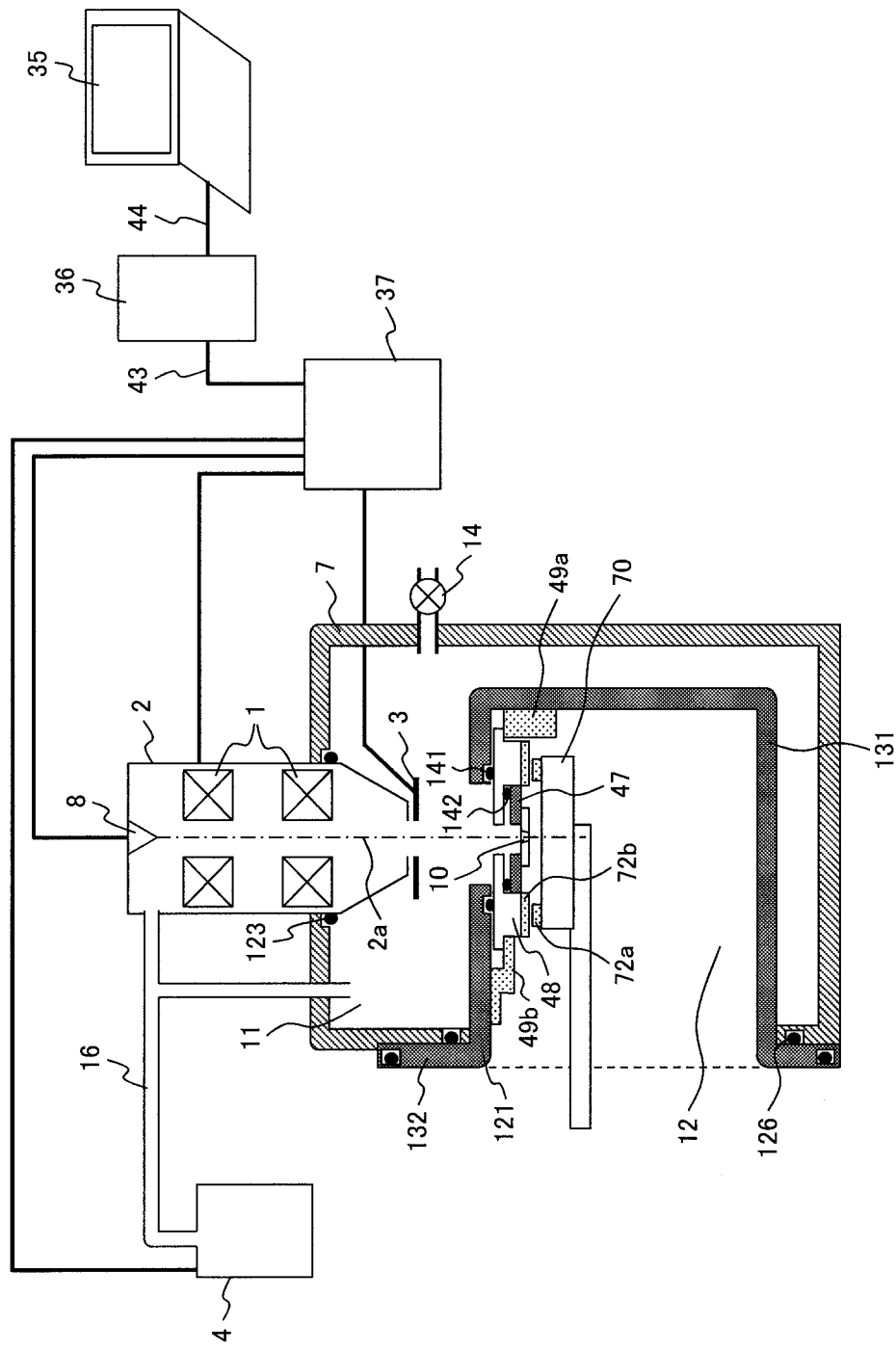
FIG. 2 is an overall configuration view of the device at the time when a movable member is operated.

FIG. 2 shows a configuration view of the device at the time when the movable member 48 is operated. FIG. 3 shows an enlarged view of a neighborhood of the diaphragm 10 in FIG. 2. In this configuration, the adjustment of the position of the diaphragm 10 is performed by operating the movable member 48. In this configuration, an adjusting jig 70 is used for the operation of the movable member 48. The adjusting jig 70 is provided with a handle 70a that is to be griped from the outside of the second housing 121.

The movable member 48 and the adjusting jig 70 are configured so as to be mechanically connected by fastening members 72a, 72b such as tacks so as to be capable of being easily removed. The fastening members that are exemplified in FIGS. 3 to 11 are collectively referred to as joint portions in the following. By engagement between the joint portion of the movable member 48 and the joint portion of the adjusting jig 70, the diaphragm is allowed to be moved.

As explained hereinafter, it is preferable that members that allows force, required at the time of moving the joint portion of the movable member 48 in a direction vertical to the optical axis of the charged particle optical lens barrel, to be increased relative to force required at the time of moving the joint portion of the adjusting jig 70 in a direction parallel to the optical axis of the charged particle optical lens barrel and separating the joint portion of the adjusting jig 70 from the joint portion of the movable member 48 are employed as the joint portions. Engagement force between the joint portions may be physical, mechanical, or electromagnetic force and any force.

A cover 71 that shields radiation such as a primary charged particle beam, a secondary particle, and an X-ray can be attached to the adjusting jig 70 as needed.

FIG. 3 shows a configuration in which pins 73 and holes 74 are employed as examples of the fastening members. The pins 73 are installed to the adjusting jig. The holes 74 in which the pins 73 are fitted are provided at the movable member 48. The pins may be provided at the movable member and the holes may be provided at the adjusting jig. Other fastening members such as male screw and female screw can also be employed. Moreover, the holes may be provided at the movable member and the pins may be provided at the adjusting jig. Application of other fastening members will be explained in detail hereinafter.

Incidentally, if the adjusting jig can be conveniently operated, the handle 70a may not be provided. In this case, it is possible for the operator to directly hold the adjusting jig 70 by his/her hand and to operate the adjusting jig.

A stage and the like are mounted to the upper portion of the second housing 121 and can be operated from the outside of the second housing. However, a space that is equal to a thickness of the stage is required between the charged particle optical lens barrel and the sample, an operation distance is forcedly increased, and deterioration of resolution of the charged article microscope is not avoided. The movable section of this configuration can be made thin since the constituent elements such as the stage mechanism and drive mechanism can be simplified by using the adjusting jig, and can suppress the deterioration of the resolution.

Figure 4B:
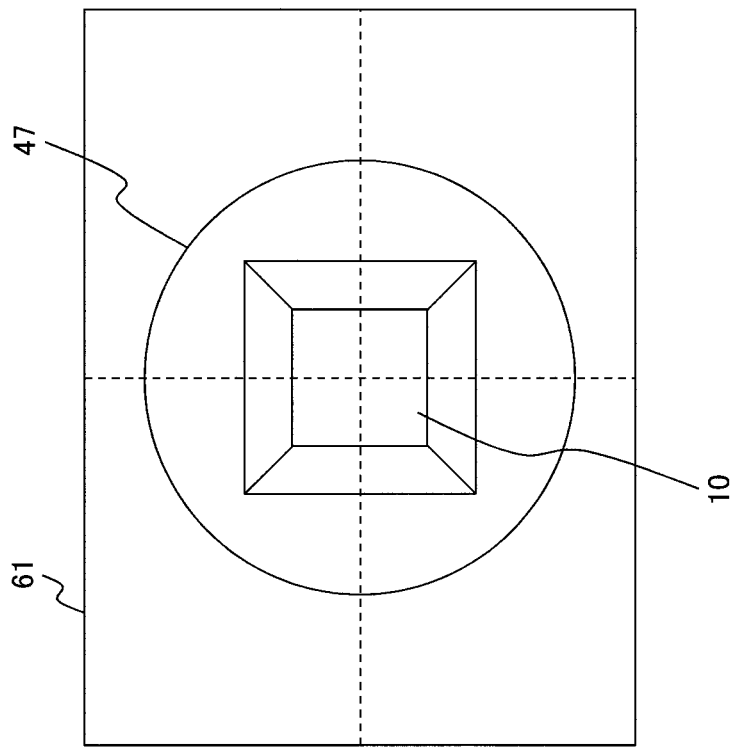
FIG. 4A and 4B are views showing an example of an image obtained by a charged particle microscope.
Figure 4A:
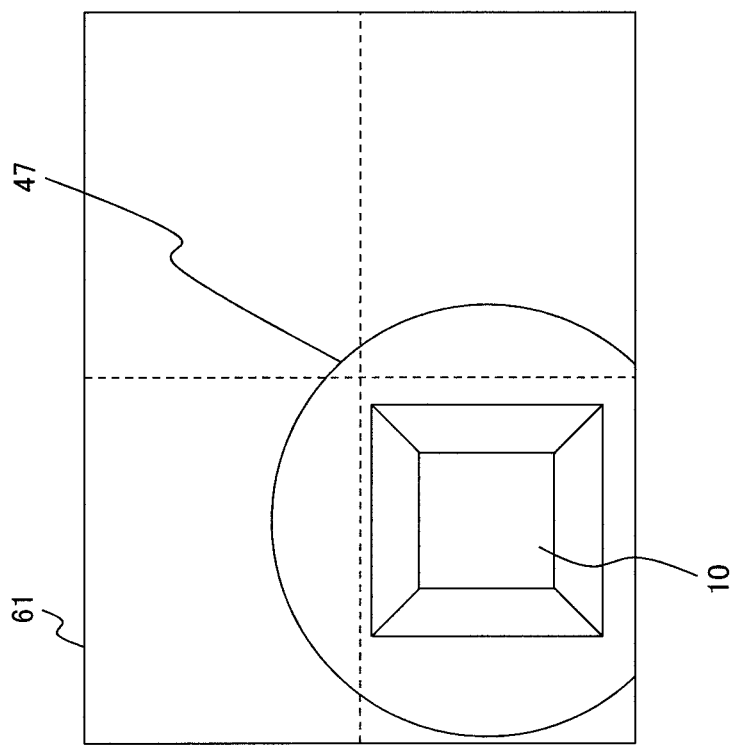

A series of operations for adjusting the position of the diaphragm will be explained with reference to FIG. 3. The adjusting jig 70 is connected to the movable member 48 and fitting of the pins 73 is performed. The movable member 48 is moved together with the diaphragm holding member 47 and the diaphragm 10 through the adjusting jig 70, to thereby perform the positional adjustment of the diaphragm 10. The position of the diaphragm 10 is adjusted in such a manner that the center of the diaphragm 10 is aligned with the charged particle optical lens barrel-optical axis 2a. FIG. 4 shows an example of an image obtained by a charged particle microscope at the time of adjusting. If the image obtained by the charged particle microscope 61 is observed, the charged particle microscope optical barrel-optical axis 2a, namely, the center of the image obtained by the microscope 61, and the center of the diaphragm 10 are misaligned as shown in FIG. 4(a). Therefore, as shown in FIG. 4(b), alignment is performed in such a manner to cause the center of the diaphragm 10 to be aligned with the center of the image obtained by the microscope 61 by using the adjusting jig 70. After the position of the diaphragm is adjusted, the adjusting jig 70 is removed and the sample is installed.

The area of the diaphragm 10 is very small, so that it is necessary to adjust the position of the diaphragm while performing observation and confirming the position of the diaphragm, by the charged particle beam microscope. On the other hand, radiations such as secondary charged particle beams and X-rays are generated when primary charged particle beams are irradiated to the sample, so that the operator may be exposed to the radiations. Therefore, the cover 71 that shields the radiations of such as the primary charged particle beams, the secondary charged particle beams, and the X-rays can be attached to the adjusting jig 70 as needed.

In this state, it is possible for the operator to perform the operation of the movable member 48 by directly inserting his/her hand into the second housing 121 from the opening portion of the second housing 121. However, by the provision of the adjusting jig handle 70a that can adjust the diaphragm outside the second housing 121, it is possible to prevent the exposure to the X-rays or the like.

As described above, the positional adjustment can be performed by the movable member 48 holding the diaphragm 10, and the adjusting jig 70, while watching the image obtained by the charged particle microscope. Therefore, it is possible to very easily perform the positional adjustment between the diaphragm center and the charged particle beam-optical axis. The configuration that allows the positional adjustment to be easily preformed can cause maintenance such as replacement of the diaphragm to be conveniently performed.

The fastening members 72a, 72b that make a mechanical connection between the movable member 48 holding the diaphragm 10, and the adjusting jig 70 will be explained hereinafter. The fastening members 72a, 72b are required to apply strong fastening force in a direction for moving the movable member 48, namely, an X-Y axis direction (shown in FIG. 3). As the fastening members, adhesive members such as double sided tapes can also be employed. However, the adjusting jig 70 is removed after the adjustment, so that if strong fastening is exhibited in a direction for removing the adjusting jig, namely, a Z-axis direction (shown in FIG. 3), the position of the movable member 48 may be moved when the adjusting jig 70 is removed. Therefore, it is preferable that the fastening force in the Z-axis direction is sufficiently small. As the fastening members 72, members to be fitted in the movable member 48, or the pins 73 and the holes 74 can be used. In this case, when the movable member 48 and the adjusting jig 70 are fastened to each other, operation for fitting the members into the movable member 48, or operation for causing the positions of the holes 74 and the positions of the pins 73 to be aligned with each other and precisely inserting the pins 73 into the holes 74 is required. Therefore, the operation becomes complicated and convenience of the device may be deteriorated. For these reasons, if members that allow misalignment in the X-Y plane direction to some extent and can perform fastening are employed, the convenience is more enhanced. In view of these requirements, fastening members that are brought into contact with each other on a plane surface, transmit force in the X-Y plane direction, and can be easily peeled off at the time of peeling the fastening members off are more preferable.

As suitable fastening members, examples of combinations of fastening members will be explained hereinafter.

Figure 5:
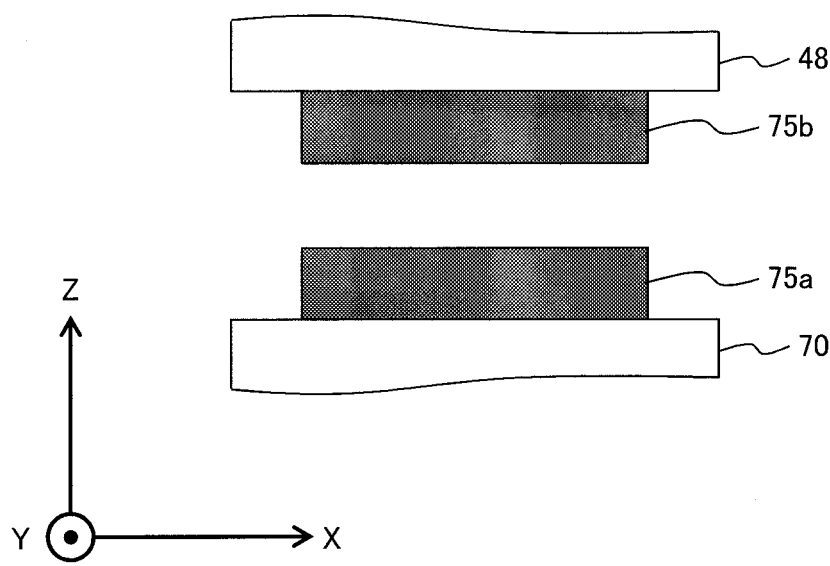
FIG. 5 is a view showing an example of a configuration in which rubber sheets are used as the fastening members.

FIG. 5 shows an example in which a rubber sheet 75a and a rubber sheet 75b are provided at the movable member 48 and the adjusting jig 70, respectively. Members with high friction coefficients, such as the rubber sheets 75a, 75b are connected with each other on a plane surface, and fastening force in the X-Y directions is generated by friction force. Fastening members that generate friction force in X-Y in-plane directions stronger than force required for moving the movable member 48 are suitable, and materials for the fastening members are not limited to rubber.

Figure 6:
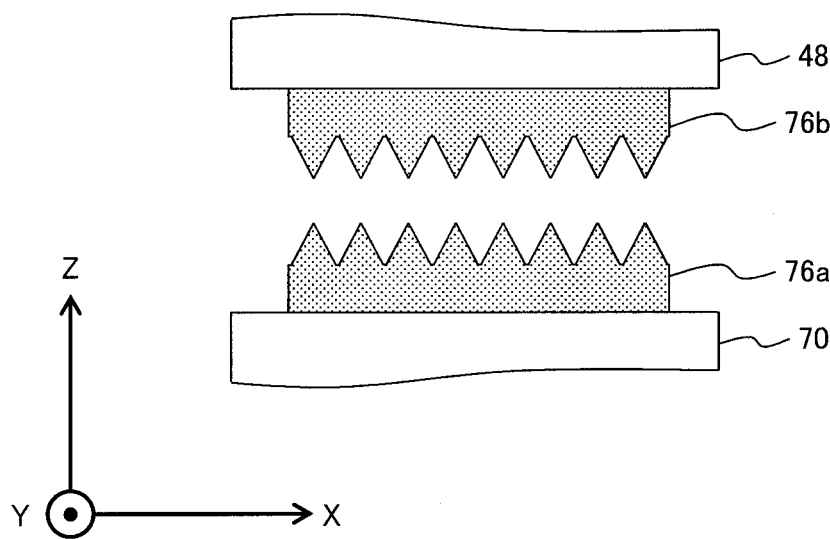
FIG. 6 is a view showing an example of a configuration in which members having concavities and convexities are used as the fastening members.

FIG. 6 shows, as another example, an example in which members having concavities and convexities on surfaces thereof are provided at the movable member 48 and the adjusting jig 70, and fastening force in the X-Y directions is generated. Members having high surface roughness, or members 76a, 76b having concavities, convexities, and protrusions are brought into contact with each other, the concavities and convexities on the surfaces are engaged with each other, whereby fastening force is generated.

Figure 7:
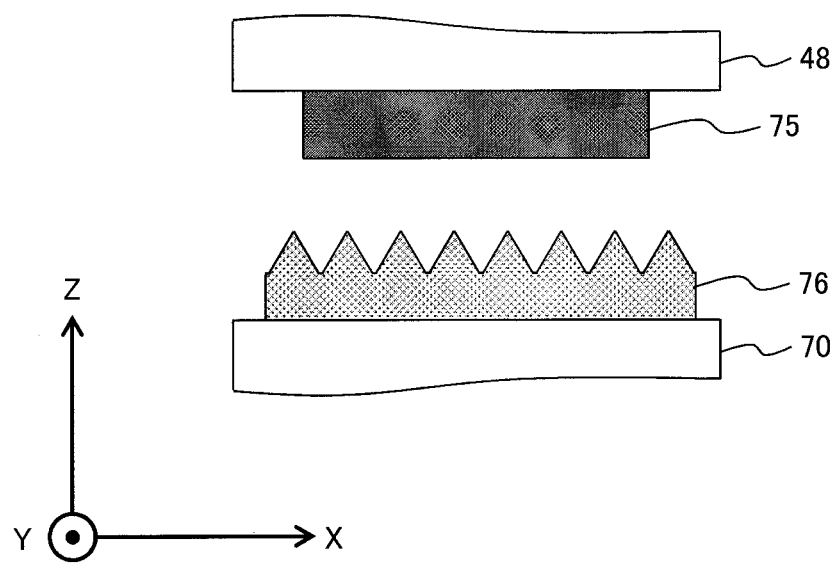
FIG. 7 is a view showing an example of a configuration in which a combination of different property members is used as the fastening members.

Moreover, as shown in FIG. 7, a combination of the former and latter, for example, a combination of a member 75 with a high friction coefficient, such as a rubber sheet, and a member 76 with protrusions, or a combination of members having different properties can be employed. In this case, they may also just generate force in the X-Y in-plane directions which is stronger than the force in the force required for moving the movable member 48.

Figure 8:
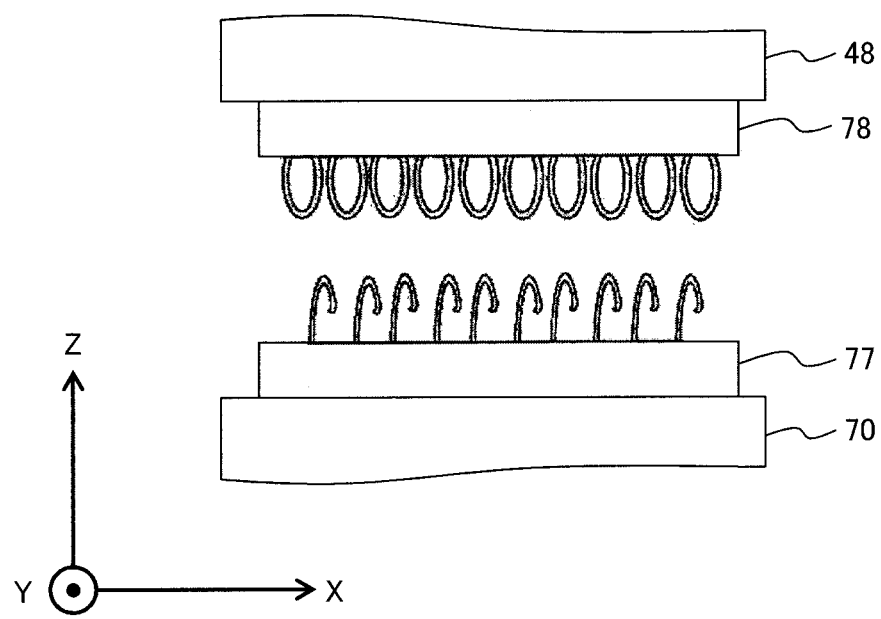
FIG. 8 is a view showing an example of a configuration in which planar fasteners are used as the fastening members.

Moreover, FIG. 8 shows an example in which the fastening force is generated by a pair of planar fasteners, one of which has hooks 77 and the other of which has loops 78. FIG. 8 shows the example in which the hooks 77 are provided at the adjusting jig 70 and the loops 78 are provided at the movable member 48, or vice versa.

Figure 9:
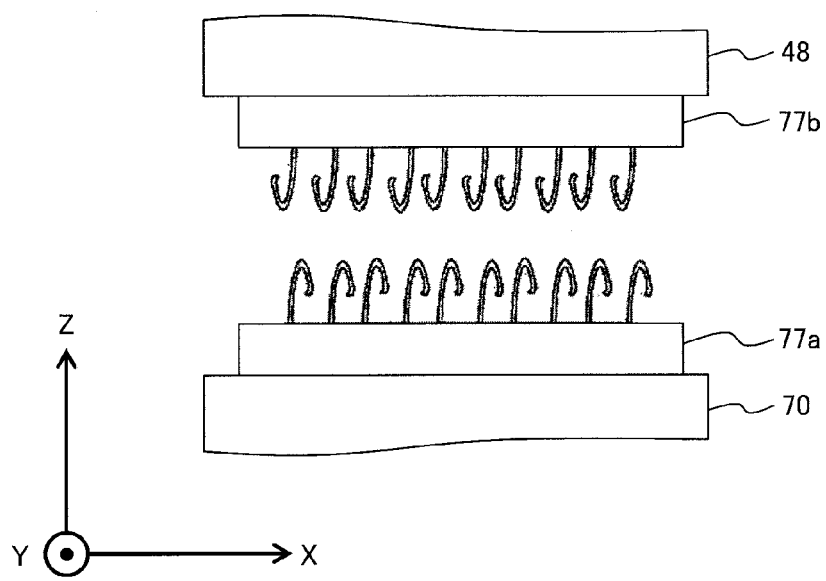
FIG. 9 is a view showing an example of a configuration in which hooks of planar fasteners are used as the fastening members.

Moreover, a combination of planar fasteners which is shown in FIG. 9 as still another example, and each of which has hooks 77 is included, as the fastening members, in the category of suitable fastening members.

Although the forms of the fastening members described above are not particularly limited, it is preferable that the fastening members are brought into contact with each other on surfaces thereof with sizes to some extent. By employing fastening members which are macroscopically in contact with each other on lines or surfaces in planes parallel to the X-Y planes, it is possible to connect the fastening members without performing the positional adjustment in the X-Y axis directions and only by an operation for bringing the adjusting jig and the movable section near in the Z-axis direction, at the time of connecting the adjusting jig and the movable section. In this way, the misalignment in the X-Y directions is permitted, the adjusting jig 70 is conveniently attached, and the adjustment of the thin film 10 can be performed.

Figure 10:
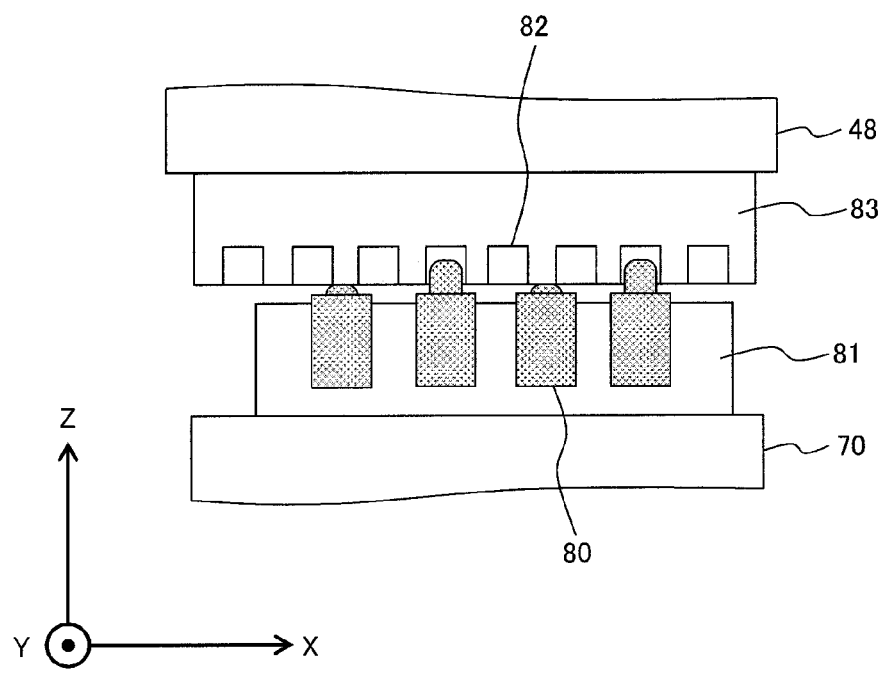
FIG. 10 is a view showing an example of a configuration in which spring plungers and holes are used as the fastening members.

Moreover, FIG. 10 shows, as another example, an example in which a spring plunger is employed. A base member 81 which has one or more spring plungers 80 and in which pins are adapted to be operatively retracted by load, and a base member 83 having one or more holes 82 in which the one or more spring plungers 80 are fitted are combined. The attaching position of the base member 81 and the attaching position of the base member 83 may be reversed. In this case, some or all of the pins are fitted in some or all of the holes. Pins which cannot be fitted in holes due to misalignment are pushed down at tip end portions thereof in the optical axis direction of a charged particle beam and operatively retracted. Thus, pins which can be fitted in holes generate the fastening force in the X-Y in-plane directions. Therefore, the base members are fastened by mechanical engagement, so that it is possible to securely perform the adjustment of the diaphragm with stronger fastening force. Intervals between or among the pins, and intervals between or among the holes may not be equal. Pitches between or among the pins, and pitches between or among the holes may be different from each other. In the case where the pitches are different, a possibility in which any pin is fitted in any hole regardless of positions in the X-Y directions is offered.

Figure 11:
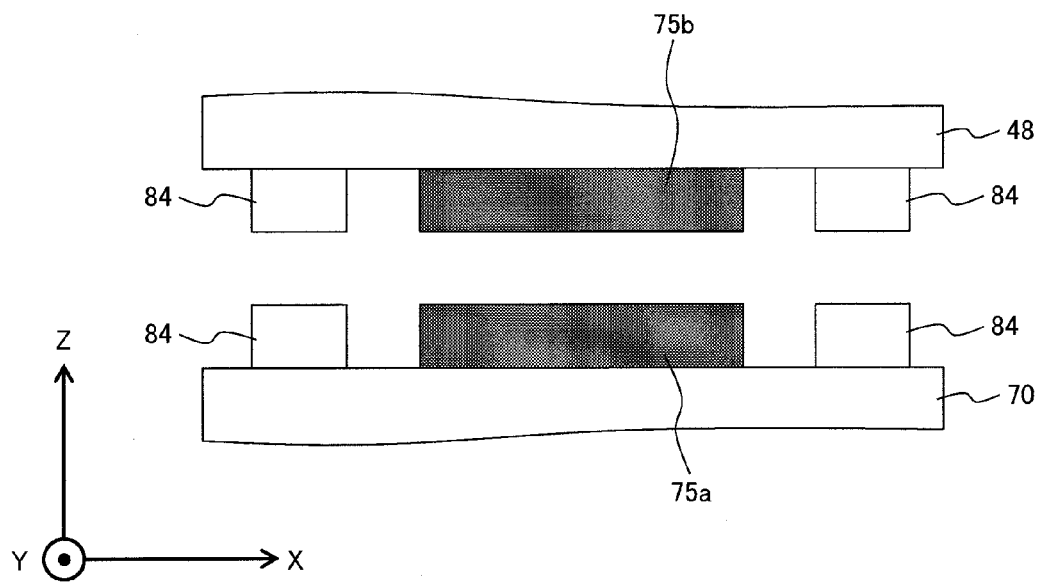
FIG. 11 is a view showing an example of a configuration in which rubber sheets and magnets are used as the fastening members.

Moreover, force in the X-Y directions and force in the Z-direction may be generated by different members which are shown in FIG. 11 as still another example. That is, it is possible to employ a configuration in which sufficiently strong fastening in the X-Y directions is achieved by using friction force generated in, for example, the rubber sheets 75a, 75b, and weak fastening in the Z-direction for stably holding the adjusting jig is achieved by members exhibiting attracting force, such as magnets 84. Moreover, the fastening force in the Z-direction serves to generate the friction force in the X-Y directions by pressing of the rubber sheets 75a, 75b in the Z-direction. The fastening force in the Z-direction for holding the adjusting jig is controlled, whereby friction force generated in the X-Y directions can be controlled. In this case, by selection of respective materials, the fastening force in the X-Y directions and the fastening force in the Z-direction can be separately varied. Therefore, it is possible to easily optimize the fastening forces and to control the fastening forces in such a manner that they become suitable fastening forces that facilitate the operations and removal.

As described above, it is possible to perform the positional adjustment of the diaphragm 10. The adjustment by using the adjusting jig 70 can be directly performed manually by the operator, and a mechanism in which the adjusting jig is automatically moved by a motor or the like can be employed.

By using the aforementioned fastening members, it is possible to easily attach the adjusting jig 70. Therefore, it is possible to realize a charged particle microscope of high convenience which can adjust the position of the diaphragm with good operability.

Figure 12:
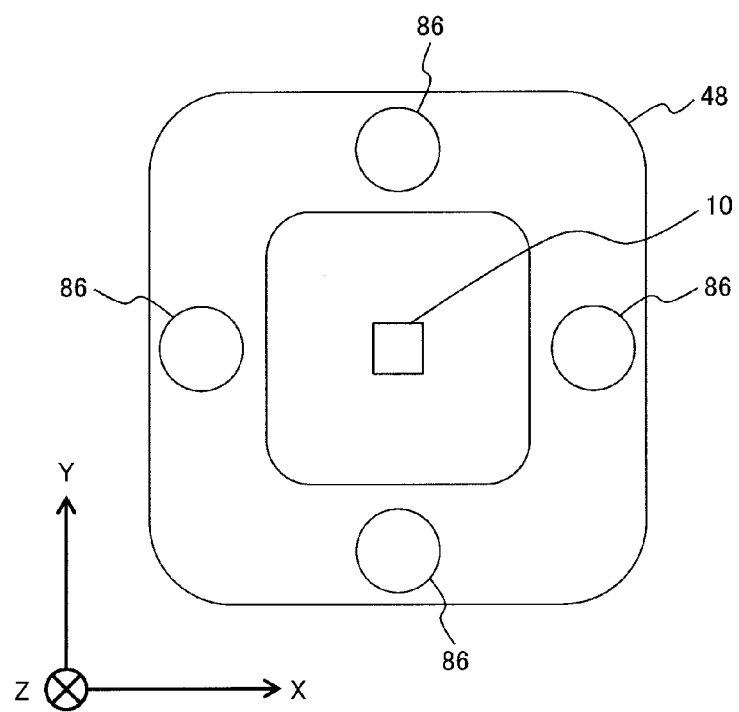
FIG. 12 is an A-A sectional perspective view of FIG. 3.

FIG. 12 is a view taken along A-A line of FIG. 3. Herein, the arrangement of the fastening members in the movable member 48 and the adjusting jig 70 are explained. The fastening member may be arranged at a portion of each of the movable member 48 and the adjusting jig 70. The movable member 48 is moved in the two X-Y directions, so that the fastening members 86 are arranged at a plurality of positions around the thin film 10, whereby the movable member can be more stably moved. Although the arranging positions of the fastening members 86 are not limited to the arranging positions of the fastening members that are shown in FIG. 12, it is desirable that the arranging positions of the fastening members are positions which allow the fastening members 86 to equally generate the fastening forces in each of the X-Y in-plane directions.

Figure 14:
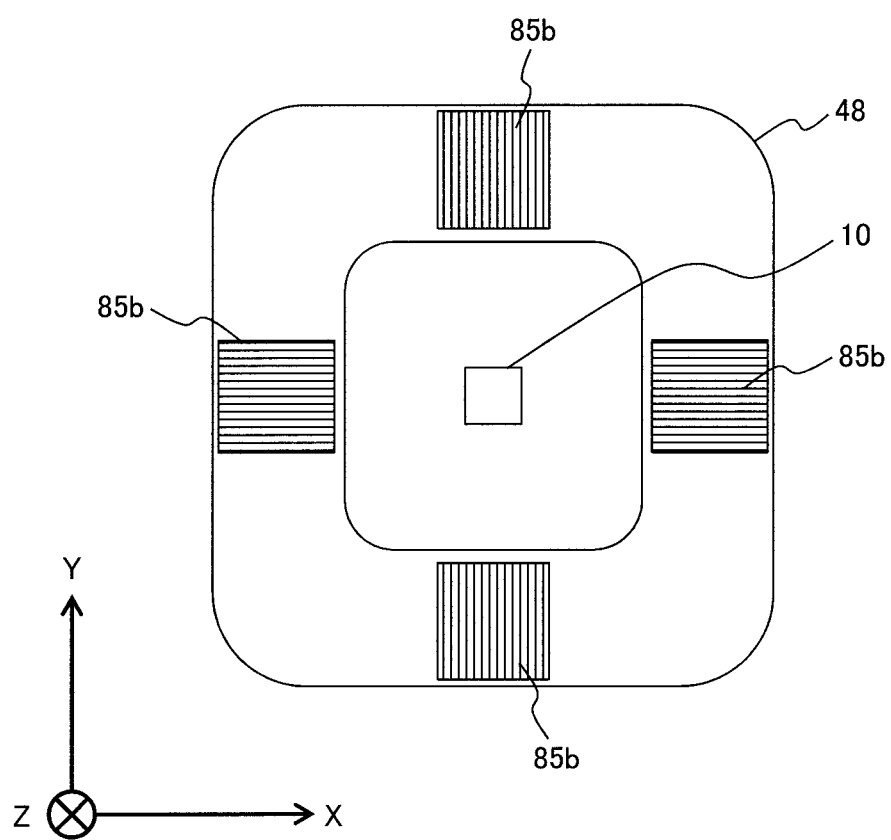
FIG. 14 is a view showing an example of an arranging configuration of the fastening members.

Moreover, according to a kind of the fastening members, for example, members having directivities in a specified direction, such as fastening members 85a, 85b having concavities and convexities on surfaces thereof and shown in FIG. 13, the fastening members are engaged with each other to generate the fastening force in an a direction, but do not generate the fastening force in a b direction and slip. When such fastening members are used, the fastening members 85a, 85b are arranged in such a manner that the arranging directions of the fastening members are changed and combined with the adjusting jig, whereby the fastening forces are generated in all of the X-Y in-plane directions. In FIG. 14, adjacent fastening members 85a, 85b are arranged in such a manner that directions to allow the fastening forces of the adjacent fastening members 85a, 85b are spaced apart at 90 degree rotational angle intervals. Although the rotational angle intervals are not limited to such intervals, it is preferable that the adjacent fastening members are arranged in such a manner to allow the directions of the fastening forces generated by the adjacent fastening members to be different from each other. Although four sets of fastening members are arranged in FIG. 14 as an example of the fastening members, they are not limited to the four sets and a plurality of fastening members can be arranged. Although shapes of the fastening members shown in FIG. 14 are shown as an example of shapes of them, it goes without saying that this arranging configuration can be applied to all of fastening members whose shapes are not limited to the illustrated shapes and generate fastening forces having directivities, for example, fastening members such as members having wedge-shaped protrusions, or plane fastener hooks.

According to this embodiment described above, it is possible to conveniently adjust the position of the thin film in the charged particle microscope which can observe a sample under the atmosphere or a gas atmosphere in an atmospheric pressure state, a state of being slightly pressurized relative to the atmospheric pressure, or a negative pressure state.

Second Embodiment

This embodiment that is applied to the charged particle microscope is explained. Incidentally, examples of the charged particle microscope include a scanning electron microscope, an ion microscope, etc. In the following, description of portions of this embodiment that are similar to those of the first embodiment will be omitted.

Figure 15:
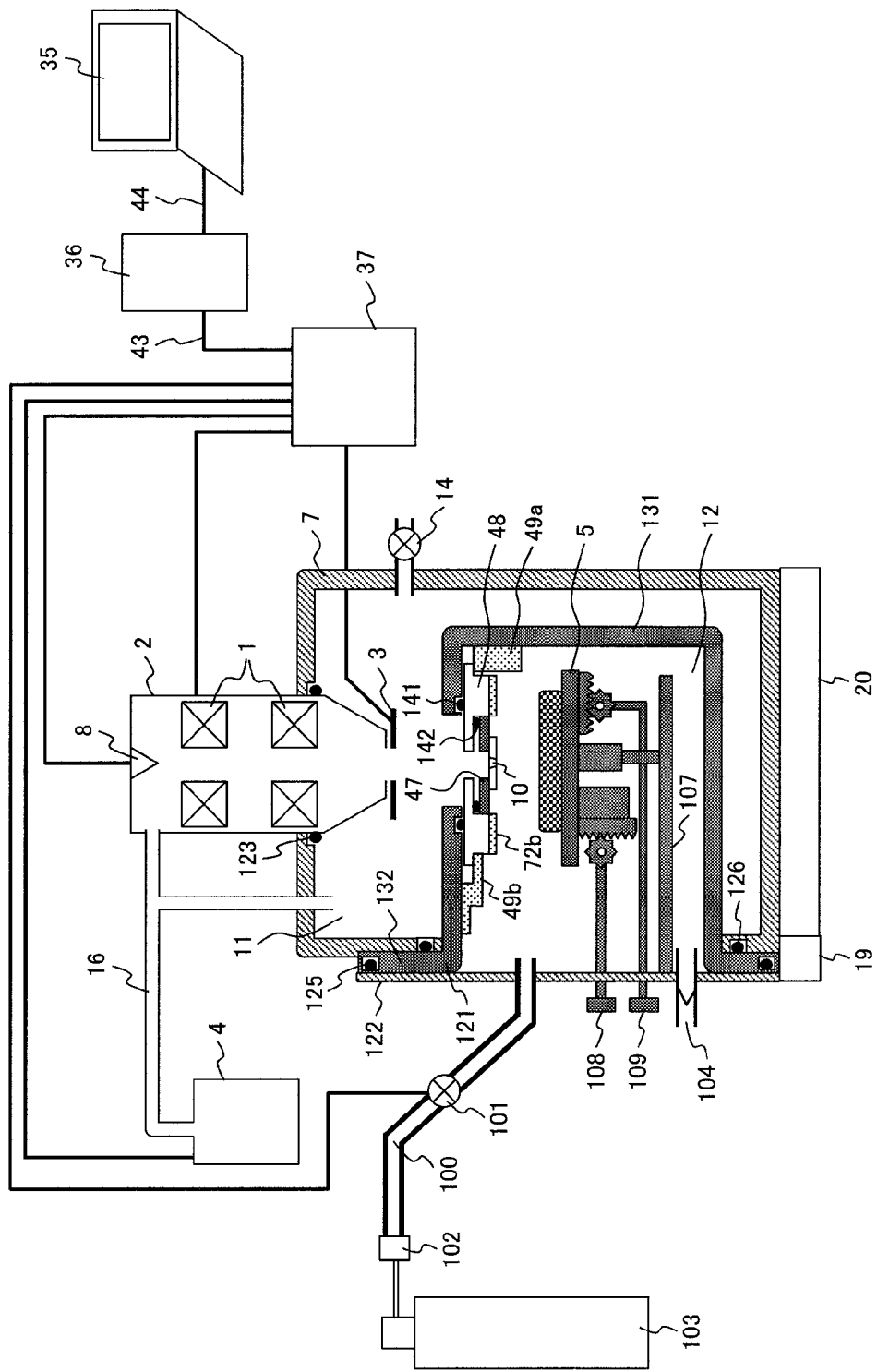
FIG. 15 is an overall configuration of a charged particle microscope of a second embodiment.

FIG. 15 shows an entire configuration view of a charged particle microscope of this embodiment. Like the first embodiment, the charged particle microscope of this embodiment includes a charged particle optical lens barrel 2, a first housing (vacuum chamber) 7 by which the charged particle optical lens barrel is supported on an installing surface of the device, a second housing (attachment) 121 which is inserted in the first housing 7 and used, and a control system and the like. Since the operations and functions of the respective constituent elements, or additional constituent elements are substantially similar to those of the first embodiment, description of them is omitted.

In the case of the charged particle microscope of this embodiment, an open face of the second housing 121 is adapted to be covered with a lid member 122, and various functions are realized. Such functions will be described hereinafter.

The charged particle microscope of this embodiment has a function of feeding a replacement gas into the second housing. A charged particle beam which is emitted from the lower end of the charged particle optical lens barrel 2 passes through a first space 11 maintained in high vacuum, passes through a thin film 10 (or an aperture member) shown in FIG. 15, and further enters a second space 12 maintained at the atmospheric pressure or at a low vacuum level (lower than the vacuum level of the first space). Incidentally, since the charged particle beam will be scattered by gas molecules in the low-vacuum-level space, a mean free path becomes short. That is, if a distance between the thin film 10 and the sample 6 is long, a secondary electron, a backscattered electron, or a transmitted electron which is generated by the charged particle beam or the charged particle beam irradiation does not arrive at the sample 6. On the other hand, the scattering probability of the charged particle beam is proportional to the mass number of the gas molecules. Therefore, if the atmosphere in the second space is replaced with gas molecules whose mass number is lower than that of the atmosphere, the scattering probability of the charged particle beam will decrease, which will allow the charged particle beam to reach the sample. The atmosphere not in the entire second housing but in at least the passage route of the electron beam in the second housing may be gas-substituted. As the type of the substitution gas, if a gas that is lighter than the atmosphere, such as nitrogen or water vapor is used, the effect of improvement in an image S/N is seen, while when a helium gas or a hydrogen gas whose mass number is lower is used, the effect of improvement in the image S/N becomes higher.

From the foregoing reasons, in the charged particle microscope of this embodiment, the lid member 122 is provided with an attachment portion (a gas introducing portion) of a gas supply pipe 100. The gas supply pipe 100 is connected to a gas cylinder 103 by a connection portion 102. Accordingly, the substitution gas is introduced into the second space 12. A gas control valve 101 is disposed on the way of the gas supply pipe 100, so that the flow rate of a substitution gas that flows through the pipe can be controlled. Therefore, a signal line extends from the gas control valve 101 to the lower-level control unit 37, so that a user of the device can control the flow rate of the substitution gas on an operation screen that is displayed on the monitor of the computer 35.

The substitution gas, which is a light-element gas, will easily accumulate in the upper portion of the second space 12, and gas in the lower side of the second space 12 is difficult to substitute. Thus, an opening that brings about communication between the outside and inside of the second space may be provided in the lid member 122 at a position lower than the attachment position of the gas supply pipe 100. In FIG. 15, the opening is provided at the attachment position of a pressure control valve 104, for example. Accordingly, since the atmospheric gas is pushed by the light-element gas introduced from the gas introducing portion and is discharged from the opening on the lower side, the atmosphere in the second housing 121 can be efficiently substituted with the gas. Incidentally, this opening may also serve as a rough evacuation port that will be described hereinafter.

Moreover, it is possible to increase an introducing amount of the substitution gas and to bring the substitution gas to a state of slightly pressurized relative to the atmospheric pressure. In this case, the opening may be closed.

Incidentally, even in the case of the light-element gas such as helium, the extent of electron beam scattering may be increased. In this case, the gas cylinder 103 may be replaced with a vacuum pump. By a light vacuum drawing, it is possible to bring the interior of the second housing to an extremely low vacuum state. For example, a vacuum evacuation port is provided at the second housing 121 or the lid member 122, and the second housing 121 may be subjected to vacuum evacuation once and brought to a slight vacuum state. This vacuum evacuation has only to allow atmospheric gas components remained in the interior of the second housing 121 to be reduced to a fixed amount or less, so that it is unnecessary to perform high vacuum evacuation and it is sufficient to perform rough evacuation. After the rough evacuation is performed, gas may be introduced into the second housing from the gas supply pipe 100. The degree of vacuum is, for example, in the range of about $10^5$ Pa to about $10^3$ Pa. In the case where the introduction of the gas is not performed, even if the gas cylinder 103 is replaced with the vacuum pump, it is possible to create a slight negative pressure state.

In a conventional so-called low vacuum scanning electron microscope, an electron beam column and a sample chamber communicate with each other, so that if the degree of vacuum in the sample chamber is reduced to create pressure close to the atmospheric pressure, pressure in the electron beam column is changed in association, and the sample chamber is difficult to be controlled in the range of about $10^5$ Pa (atmospheric pressure) to about $10^3$ Pa. According to this embodiment, the second space and the first space are separated from each other by the thin film 10, so that it is possible to freely control the pressure and gaseous species in the second space surrounded by the second housing 121 and the lid member 122. Therefore, it is possible to perform the control of the sample chamber in the range of about $10^5$Pa to about $10^3$Pa, which hitherto is difficult to be performed. In addition to the observation at atmospheric pressure (about $10^5$Pa), it is possible to observe the state of the sample by successively changing the pressure to a level close to the atmospheric pressure.

Incidentally, in a case where a sample containing moisture, such as a biological sample, is observed, the sample that is placed in a vacuum state once is changed in a state thereof by moisture vaporization. Therefore, as described above, it is preferable that the substitution gas is introduced from an atmospheric environment. The above-mentioned opening is closed by the lid member after the introduction of the substitution gas, whereby the substitution gas can be effectively confined in the second space 12.

If a three-way valve is provided at the above-mentioned opening, the opening can be used both as a rough evacuation port and an exhaust opening for leaking into the atmosphere. That is, a way of the three-way valve is attached to the lid member 122, another way of the three-way valve is connected to the vacuum pump for rough evacuation, and a leak valve is attached to a remaining way of the three-way valve, thus making it to realize the exhaust opening.

Instead of the above-mentioned opening, a pressure control valve 104 may be provided. The pressure control valve 104 has a function of automatically opening when the pressure in the interior of the second housing 121 becomes 1 atm or more. In the case where the pressure control valve with such a function is provided, the pressure control valve automatically opens when the interior pressure becomes 1 atm or more at the time of introduction of a light-element gas, whereby atmospheric gas components such as nitrogen and oxygen are discharged out of the device and the device interior can be filled with the light-element gas. Incidentally, the illustrated gas cylinder 103 may be provided at the charged particle microscope or attached by the user of the device ex post facto.

Unlike the first embodiment, the charged particle microscope of this embodiment includes a sample stage 5 as an observation visual field moving means. The sample stage 5 is provided with an X-Y drive mechanism in the in-plane direction, and a Z-axis drive mechanism in a height direction. A support plate 107 that forms a bottom plate supporting the sample stage 5 is attached to the lid member 122. The sample stage 5 is fixed to the support plate 107. The support plate 107 is provided so as to extend toward a surface of the lid member 122 that faces the second housing 121, and toward the interior of the second housing 121. A support shaft and a support shaft are extended from the Z-axis drive mechanism and the X-Y drive mechanism, respectively. An operation knob 108 is provided at one of the support shafts and an operation knob 109 is provided at the other of the support shafts. The user of the device adjusts the position of the sample 6 in the second housing 121 by operating the operation knobs 108, 109.

Figure 16:
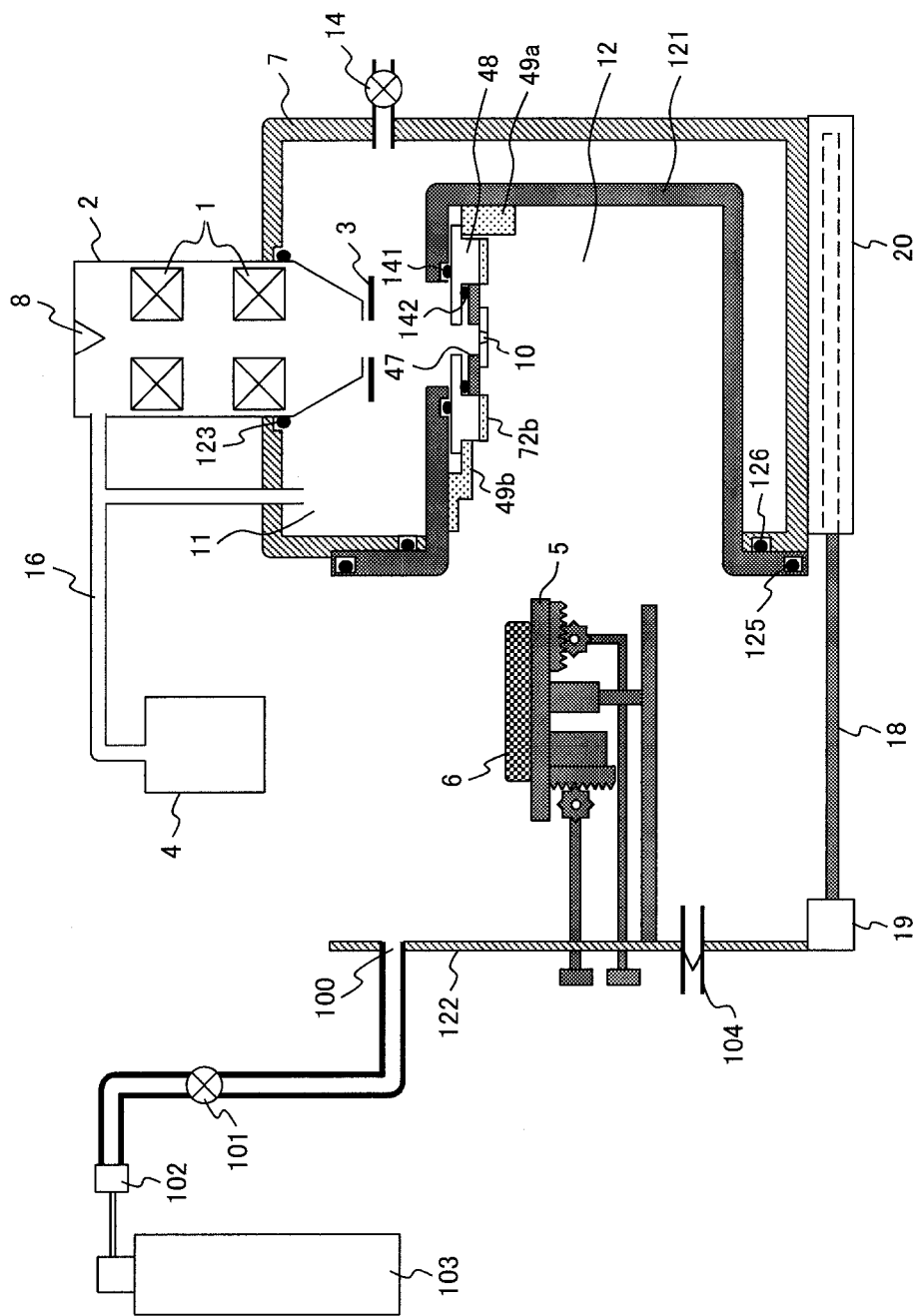
FIG. 16 is a view showing the charged particle microscope of the second embodiment in a state where plate members are drawn out.

Next, a replacement mechanism for a sample 6 is explained. The charged particle microscope of this embodiment includes a lid member supporting member 19 and a bottom plate 20 which are provided on a bottom surface of the first housing 7 and the undersurface of the lid member 122. The lid member 122 is detachably fixed to the second housing 121 via a vacuum sealing member 125. The lid member supporting member 19 is detachably fixed to the bottom plate 20. As shown in FIG. 16, the lid member 122 and the lid member supporting member 19 can be detached from the second housing 121 as a whole.

The bottom plate 20 is provided with a column 18 that is used as a guide at the time of removal. The column 18 is configured so as to be stored in a storage portion, provided at the bottom plate 20, at the time of ordinary observation, and so as to extend in a drawing direction of the lid member 122 at the time of removal. The column 18 is fixed to the lid member supporting member 19. The lid member 122 and the body of the scanning electron microscope are adapted so that they are not perfectly separated from each other at the time of removing the lid member 122 from the second housing 121. Thus, it is possible to prevent the sample stage 5 or the sample 6 from falling down.

When the sample is carried in the second housing 121, first of all, the Z-axis operation knob of the sample stage 5 is turned to move the sample 6 away from the thin film 10. Next, the pressure control valve 104 opens and the interior of the second housing is released to the atmosphere. After confirming that the second housing interior is not brought to a depressurized state or an extreme re-pressurization state, the lid member 122 is drawn out toward a side opposite to the device body. Thus, the sample 6 is brought to a state where it is allowed to be replaced. After the replacement of the sample, the lid member 122 is pushed into the second housing 121, the lid member 122 is fixed to the mating portion 132 by an unshown fastening member and, thereafter, introduction of a substitution gas is performed as needed. The above-mentioned operations can also be performed in a state where voltage is applied to the optical lenses 2 in the charged particle optical lens barrel 2, or in a state where a charged particle beam is emitted from the charged particle source 8. Therefore, the charged particle microscope of this embodiment can start to perform observation after the replacement of the sample.

Figure 17:
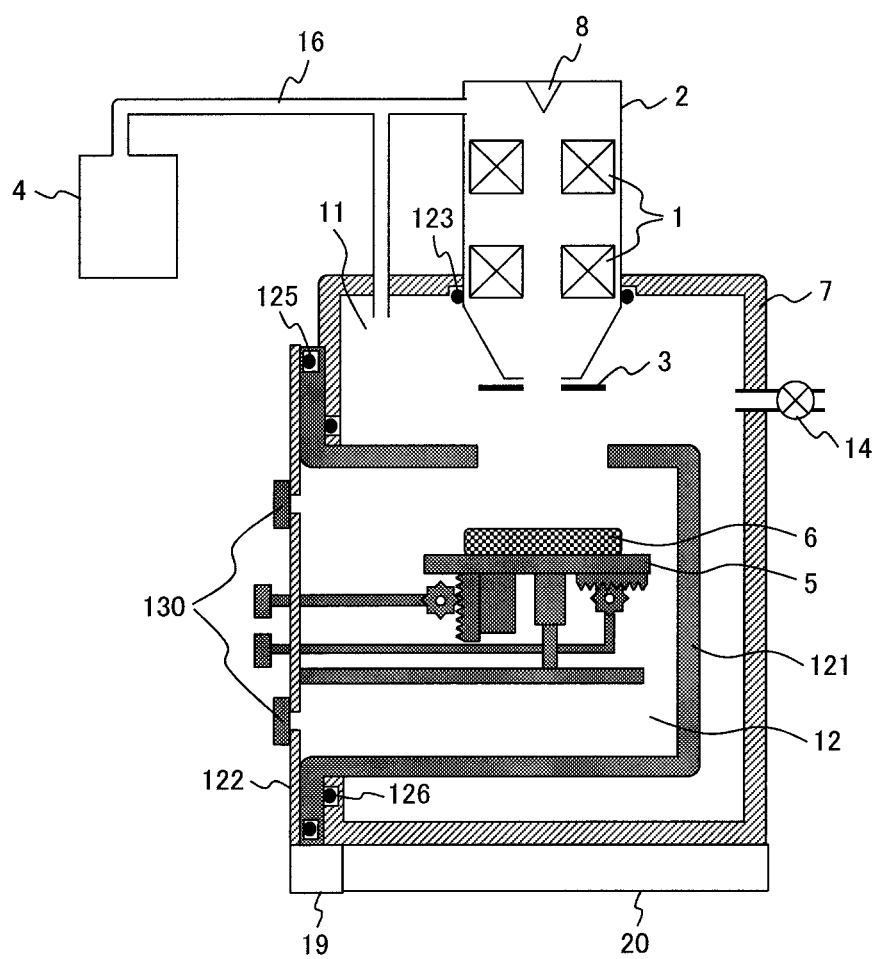
FIG. 17 is a view showing the charged particle microscope of the second embodiment in a state of being used as a high-vacuum SEM.

The charged particle microscope of this embodiment can also be used as a general high-vacuum SEM. FIG. 17 shows an overall configuration view of the charged particle microscope used as the high-vacuum SEM. Since a control system of the embodiment shown in FIG. 17 is similar to that shown in FIG. 15, illustration of it is omitted in FIG. 17. FIG. 17 shows the charged particle microscope in a state where positions to which the gas supply pipe 100 and the pressure control valve 104 are attached are closed by a lid member 130 after the gas supply pipe 100 and the pressure control valve 104 are removed from the lid member 122 in a state where the lid member 122 is fixed to the second housing 121. In an operation prior and subsequent to this, if the diaphragm 10 and the diaphragm holding member 47 are removed from the second housing 121, it is possible to cause the first space 11 and the second space 12 to communicate with each other and to cause the interior of the second housing to be subjected to vacuum evacuation by the vacuum pump 4. Thus, it is possible to perform high vacuum SEM observation in an attached state of the second housing 121.

Incidentally, as a variant of the configuration shown in FIG. 17, the second housing 121 having the diaphragm holding member 47 attached thereto may be removed as a whole and the lid member 122 may be fixed directly to the mating surface of the first housing 7. By this configuration, it is possible to also cause the first space 11 and the second space 12 to communicate with each other and to cause the interior of the second housing to be subjected to vacuum evacuation. Incidentally, this configuration is similar to the configuration of the general SEM device.

As described above, in this embodiment, all of the sample stage 5, operation knobs 108, 109, gas supply pipe 100, and pressure control valve 104 are integratedly attached to the lid member 122. Therefore, it is possible for the user of the device to perform the operation of the operation knobs 108, 109, the replacing operation of the sample, and detaching/attaching operation of the gas supply pipe 100 and the pressure control valve 104, with respect to the same face of the first housing. Thus, as compared to a charged particle beam microscope with a configuration in which the above-mentioned elements are separately attached to other surfaces of a sample chamber, an operability at the time of switching the state for observation under atmospheric pressure and the state for observation under high vacuum is highly improved.

Figure 18:
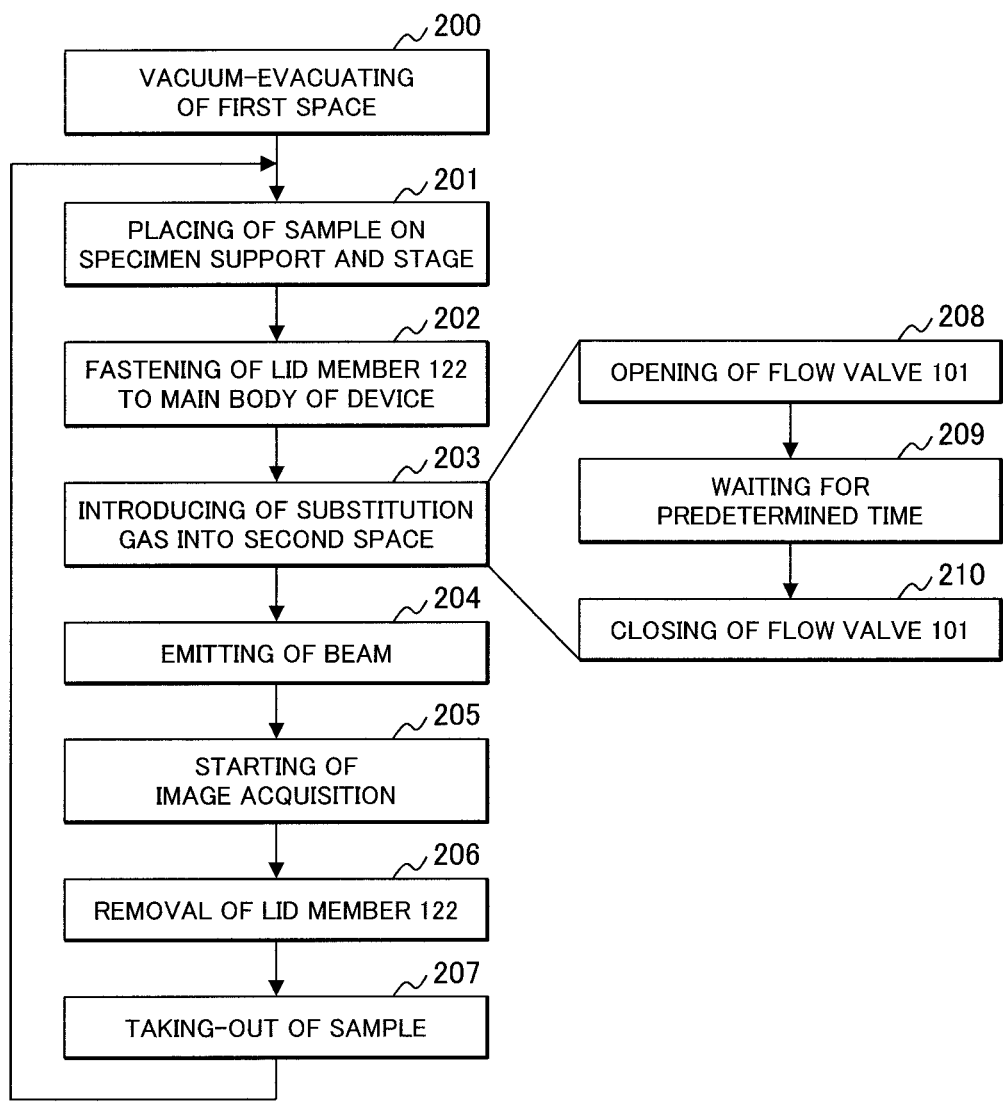
FIG. 18 is an explanation view of an operation of the charged particle microscope of the second embodiment.

FIG. 18 shows a flowchart showing an operation flow of the charged particle microscope of this embodiment. In first step 200, the first space is vacuum-evacuated. The first space may be previously vacuum-evacuated. In second step 201, the sample 6 is placed on the specimen support on the sample stage 5. In third step 202, the sample stage 5 that is provided at the lid member 122 is introduced into the second housing and fastened to the main body of the device (second housing). In fourth step 203, the gas control valve 101 is opened for given period of time and then closed, whereby a substitution gas such as a helium gas is introduced into the second space. In fifth step 204, the operation conditions of the charged particle optical lens barrel are adjusted to cause an electronic beam to be emitted. In sixth step 205, image acquisition is started. When the image acquisition is finished, in seventh step 206, the lid member 122 is removed. The substitution gas confined in the second space is released to the outside of the device. Although the substitution gas confined in the second space is released to the outside of the device, the lid member may be removed after the pressure adjusting valve is opened and the substitution gas is discharged. In eighth step 207, the sample is taken out. If another sample is to be observed, the flow is returned to the second step 201.

Incidentally, the second space can not only be set to the atmospheric pressure state with a substitution gas being introduced thereinto, but also be set to a low vacuum state with a substitution gas being introduced thereinto in a small quantity, or can be set to a vacuum state. In this case, flow control of the substitution gas or vacuum evacuation may be performed in the fourth step 203. Incidentally, the flow shown in FIG. 18 is only an example of operational procedures and the order thereof may be changed as appropriate.

In addition to the configuration described above, a contact monitor that detects a contact state between the second housing 121 and the lid member 122 may be provided, to thereby monitor whether the second space is closed or opened.

Moreover, in addition to the secondary electron detector and the backscattered electron detector, an X-ray detector or photoelectric detector may be provided in such a manner to be capable of performing EDS spectrometry and detection of fluorescent radiation. Regarding arranging of the X-ray detector and photoelectric detector, they may be arraigned in the first space 11 or second space 12.

Moreover, when a charged particle beam is irradiated to the sample, absorption current flows in the sample. Therefore, an ammeter may be provided in such a manner to measure current that flows in the sample 6 or the specimen support. It is thereby possible to acquire the absorption current image (or an image using an absorption electron). Moreover, a transmitted electron detector may be arranged below the specimen support in such a manner that an image obtained by a scanning transmitted electron microscope (STEM) can be acquired. The specimen support itself may be configured as a detector.

Moreover, voltage may be applied to the sample stage 5. If the voltage is applied to the sample table 5, it is possible to cause an electron emitted from the sample 6 to have high energy, it is possible to increase a signal quantity, and an image S/N is improved.

Moreover, the configuration of this embodiment can be applied to a small-sized charged particle beam lithography device. In this case, the detector 3 is not always required.

Next, a position adjusting method for the diaphragm 10 will be described. In the first embodiment, the case where the operator performs the positional adjustment from the outside of the housing 2 by using the jig is explained. In the configuration of this embodiment, an adjusting jig 145 (adjusting unit) is attached to the sample stage 5, and engagement between the adjusting jig 145 and the movable member 48, and positional adjustment of the diaphragm 10 can be performed by operation of the sample stage 5, to thereby realize various functions.

Since the configuration of the movable member 48 attached to the second housing 121 is the same as that of the first embodiment, explanation of it is omitted.

Figure 19:
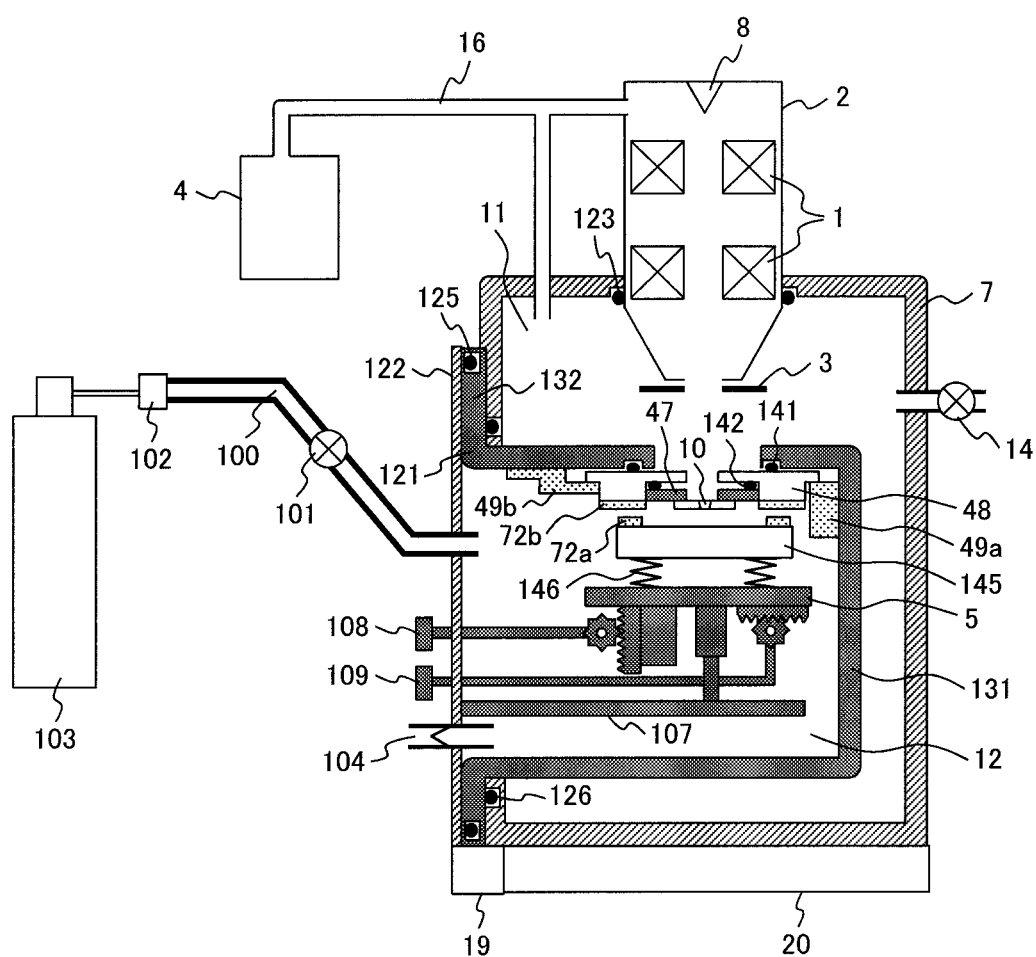
FIG. 19 is an overall configuration view of the device at the time when a movable member of the second embodiment is operated.

FIG. 19 shows a configuration in which the diaphragm is adjusted. The adjusting jig 145 is configured so as to be attached to a member that is operated in interlock with the operation of a Z-axis drive mechanism. Particularly, from the viewpoint of ease of handling, it is preferable that the adjusting jig 145 is configured so as to be installed on a sample mounting member on the sample stage. Concretely, a mounting portion that is engaged in shape with the sample mounting member on the sample stage is provided at the adjusting jig 145. The adjusting jig 145 is configured to be attached to the sample mounting member, whereby the operator can easily attach the adjusting jig 145 with a sense of attaching the sample at the time of normal observation.

The adjusting jig 145 is brought near the movable member 48 to connect the fastening members 72a, 72b (joint portions). As the fastening members 72a, 72b, tacks and the like, or different fastening members can be used in the same manner as being used in the first embodiment. When the fastening members such as the pins 73 and the holes 74 which are described in connection with the first embodiment are used in order to connect the fastening members 72a, 72b, operation of connecting the pins 73 and the holes 74 while operating the XY drive mechanism for the sample stage 5 and aligning the pins 73 and the holes 74 by the X-Y drive mechanism is required. Particularly, in the case of this configuration, the fastening members that are described in connection with the first embodiment and allow misalignment of the fastening members 72a, 72b in the X-Y directions to some extent are just suitable. In the case of using them, operability becomes very improved.

When the fastening members 72a, 72b are connected, there is a possibility that the adjusting jig 145 is excessively pressed against the movable member 48 by operation mistake of the Z-drive mechanism. At this time, there is a possibility that the Z-drive mechanism, the movable member 48, the adjusting jig 145, and other members are damaged. Therefore, elastic members 146 may be arranged between the adjusting jig 145 and the sample stage 5 in order that the adjusting jig 145 is held by the elastic members 146. In the case where the adjusting jig 145 is excessively pressed against the movable member, the elastic members 146 are deflected, to thereby relax a load and avoid damages of the respective members. In the case of the manual stage, the operator can sense the connection state of the fastening members 72a, 72b by feeling gradual changes of operating force by the deflection of the elastic members 146.

A series of operations from the positional adjustment of the diaphragm to the observing of the sample will be described. The sample stage 5 is drawn out of the second housing 121 and the sample 6 is then removed. The adjusting jig 145 is mounted to the sample stage 5. The sample stage 5 is inserted into the second housing 121 and the adjusting jig 145 is moved immediately below the diaphragm 10. A Z-axis knob is turned to move the sample stage in an optical axis direction, whereby the adjusting jig 145 is brought near the movable member 48 that is a diaphragm adjusting mechanism and the fastening members 72a, 72b are connected. By operating an X-Y knob for the sample stage 5 while confirming an observation image, the diaphragm 10 is moved, and a center of the diaphragm 10 is adjusted so as to be aligned with a center of the image. Once the adjusting is finished, the Z-axis knob is operated to move the sample stage in the optical axis direction, whereby the adjusting jig 145 and the movable member 48 are separated from each other and the connection therebetween is released. After the sample stage 5 is drawn out of the second housing 121 and the adjusting jig 145 is removed, the sample 6 is mounted to the sample stage 5 which is then inserted into the second housing 121. The positional adjustment of the diaphragm is finished by these operations, and it is possible to start the observation of the sample 6.

Incidentally, the adjusting jig 145 may be attached to member that is moved in interlock with the operation of the Z-axis drive mechanism for the sample stage 5. The adjusting jig 145 may be configured so as to be attached to or permanently provided at a position which does not allow the adjusting jig to interfere with the sample 6. The sample observation may be performed in the attached state of the adjusting jig 145.

Figure 20:
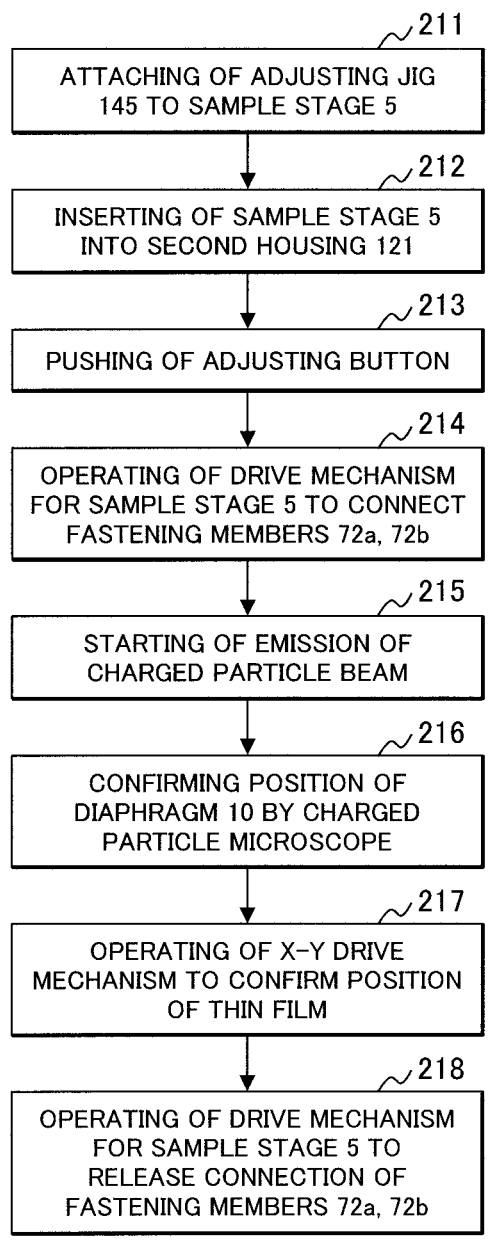
FIG. 20 is an explanation view of an operation of adjusting a position of a thin film.

FIG. 20 shows a flowchart showing a diaphragm position adjusting operation flow in a case where a motor drive stage is used. In first step 211, the adjusting jig 145 is attached to a predetermined position of the sample stage 5. In second step 212, the sample stage 5 is inserted into the second housing 121. In third step 213, an adjusting button or the like on a screen is pushed. By pushing the adjusting button, the operation of the sample stage in fourth step is started. In the fourth step 214, an X-Y-Z drive mechanism is operated and the adjusting jig 145 and the fastening members 72a, 72b of the movable member 48 are connected. In fifth step 215, the emission of a charged particle beam is started and an image obtained by a charged particle microscope is displayed. In sixth step 216, the positional adjustment of the diaphragm 10 is performed by the operator while observing the image. In seventh step 217, once the adjusting is finished, the Z-axis drive mechanism is operated, the connection of the fastening members 72a, 72b is released.

Although the aforementioned operations have been explained using the motor drive stage, the operations can be performed by using a manual stage. Moreover, in the state where the motor drive mechanism stage is used, the operations can be performed by automatic control.

In the fourth step by the automatic control, a sensor that detects the deflection of the elastic members 146 and adjusting jig 145 may be installed. By the sensor, it is possible to detect the pressing of the adjusting jig 145, possible to give a warning to the operator, and possible to stop the operation of the sample stage 5. In this case, the computer 35 includes a detection section and a warning output section. The detection section detects the displacement of the adjusting jig 145 according to change of a signal from the sensor detecting the displacement of the adjusting jig 145, and outputs a signal (fastening signal), indicating that the adjusting jig 145 is pressed, to the warning output section when the change reaches to a predetermined value. The warning output section receives the fastening signal, to thereby output a stop signal to a sample stage drive mechanism included in the upper-level control unit 36 or the lower-level control unit 37, and stop the Z-axis drive mechanism for the sample stage 5. Moreover, a message that indicates the pressing of the adjusting jig 145 may be displayed on the screen of the computer 35.

In the sixth step in the automatic control, the position of the diaphragm 10 is confirmed by causing the operator to select a specified position of the diaphragm 10, for example, a bottom right corner or the like of the diaphragm, on the image display section 51, the X-Y drive mechanism for the sample stage 5 is operated, and the diaphragm 10 can be moved to the center of the image. Moreover, the detection of the position of the diaphragm 10 can be automatically detected by image recognition. In this case, the computer 35 includes an image recognition section, an arithmetic operation section, and a stage control section. The image recognition section detects a specific position such as an edge of the diaphragm 10 from the image obtained by the charged particle microscope and outputs a coordinate value on the image obtained by the microscope to the arithmetic operation section. The arithmetic operation section calculates a moving amount that is required in order to move the diaphragm 10 to the center of the image obtained by the microscope, and outputs the moving amount as a signal to the stage control section. The stage control section outputs a signal, instructing movement of the sample stage 5 by the moving amount, to the stage drive section included in the upper-level control unit 36 or the lower-level control unit 37, and the sample stage 5 is operated. By these operations, the diaphragm 10 is moved to the center of the image.

According to this embodiment, in addition to the effects exerted in the first embodiment, a charged particle microscope that can be used as a high vacuum SEM and can easily perform observation under a gas atmosphere in an atmospheric pressure or slightly negative pressure state is realized. Moreover, the observation can be performed with introducing of a substitution gas, so that the charged particle microscope of this embodiment can acquire a good S/N image as compared to the charged particle microscope of the first embodiment. Moreover, the sample stage is used for adjusting the diaphragm, so that the operator can easily perform the positional adjustment of the diaphragm with the same operation as in the normal observation.

Incidentally, although the configuration example to be intended for a desktop-type electron microscope has been described in connection with this embodiment, this embodiment can be applied to a large-sized charged particle microscope. In the case of the desktop-type electron microscope, the entire device or the charged particle optical lens barrel is supported on the installing surface of the device by the housing. In the case of the large-sized charged particle microscope, the entire device may be carried on a cradle. Therefore, if the second housing 7 is carried on the cradle, the configuration which has been described in connection with this embodiment can be applied to the large-sized charged particle microscope as it is.

Third Embodiment

Figure 21:
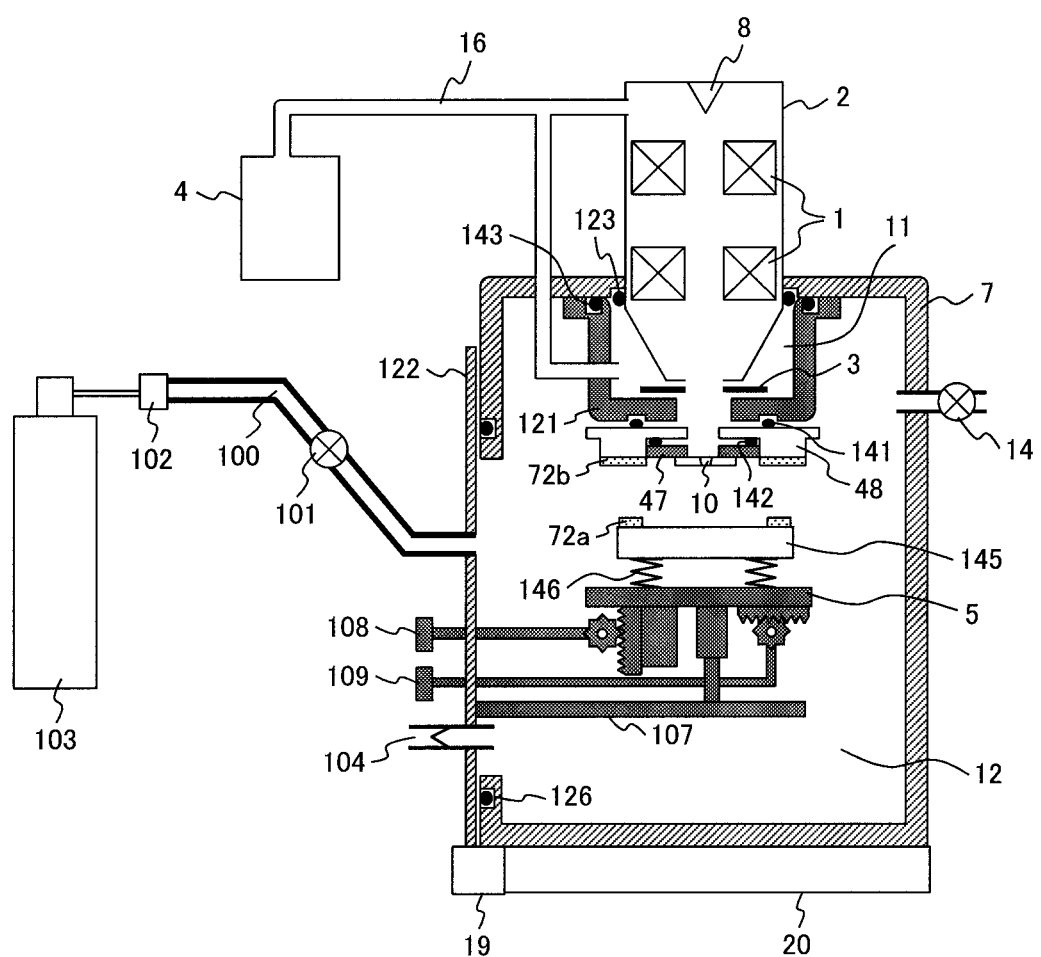
FIG. 21 is an overall configuration view of a charged particle microscope of a third embodiment.

FIG. 21 shows an entire configuration view of a charged particle microscope of a third embodiment. In the following, description of portions similar to those of the first and second embodiments will be omitted.

In a charged particle microscope to which the configuration described in connection with the first embodiment or 2 is applied and which has a relatively large-sized sample chamber (first housing), the second housing must be made large, large-scale modifications are required, and it is not suitable for the purpose of simply realizing the observation under the atmospheric pressure.

In this embodiment, the second housing 121 that is described in connection with the first and second embodiments is arranged immediately below the charged particle optical lens barrel 2. That is, a pan-shaped attachment (second housing 121) is employed and fitted into the first housing 7 from an upward direction and, further, the charged particle optical lens barrel 2 is fitted from the upward direction. In the state where the attachment is attached to the first housing, the attachment has a shape protruding in the interior of the first cubic-shaped housing 7. In this state, a closed space (second space 12) that is defined by the inner wall faces of the first housing 7, the outer wall faces of the second housing, and the diaphragm 10 becomes a space in an atmospheric pressure state, and the interior (first space 11) of the second housing 121 communicating with the charged particle optical lens barrel becomes a space that is to be vacuum-evacuated.

The first housing 7 is vacuum-sealed with respect to the charged particle optical lens barrel 2 by the vacuum sealing member 123 and, further, the second housing 121 is vacuum-sealed with respect to the first housing 7 by the vacuum sealing member 143.

Like the first and second embodiments, the second housing 121 includes the diaphragm 10, the diaphragm holding member 47, and the movable member 48. They are arranged immediately below the charged particle optical lens barrel 2. Although the detector is arranged in the first space 11 in FIG. 21, the detector may be arranged in the second space 12 or the charged particle optical lens barrel 2. Since other functions including the diaphragm adjusting or the like are similar to those of the first and second embodiments, detailed description of them is omitted.

In the case of this configuration, the volume of the second space 12 can be increased as compared to that of the second space shown in FIG. 15. As compared to the configuration of second embodiment, this embodiment allows a large sample to be arranged in the second space.

Fourth Embodiment

Figure 22:
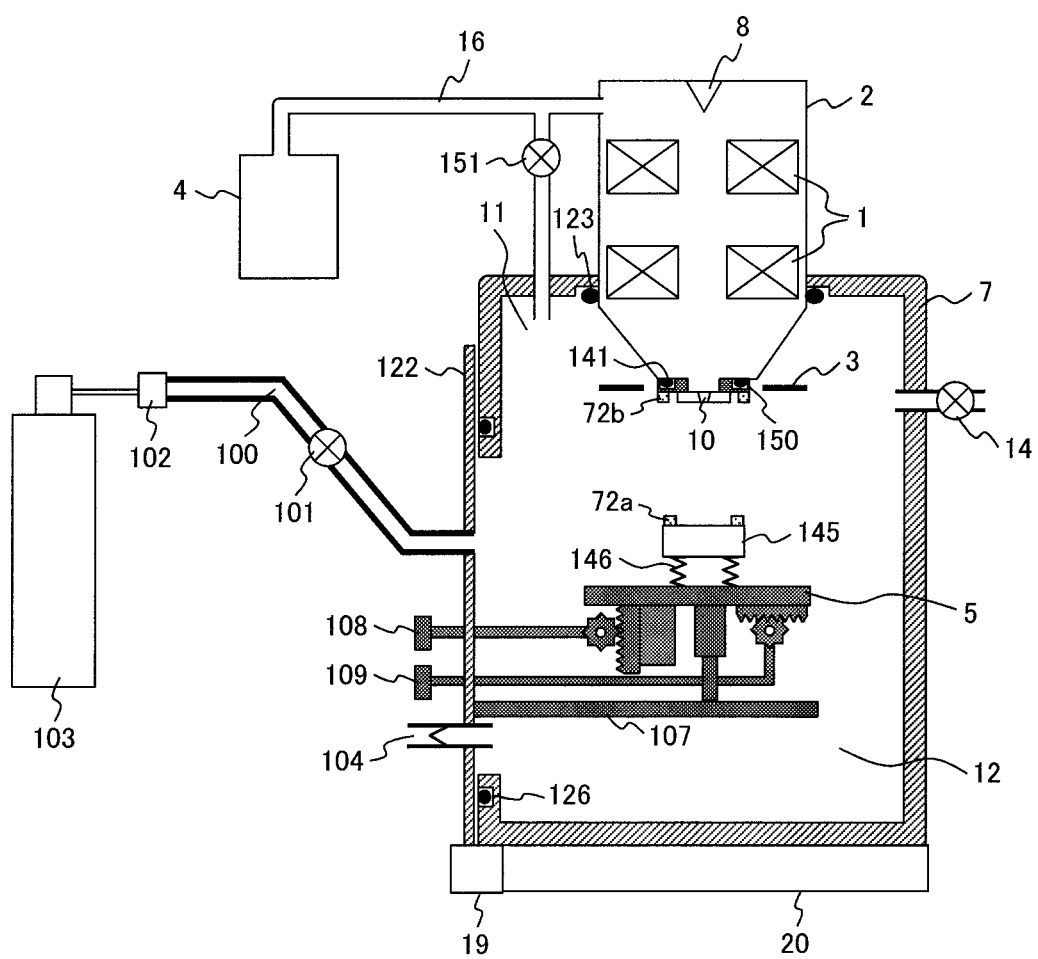
FIG. 22 is an overall configuration view of a charged particle microscope of a fourth embodiment.

FIG. 22 shows a fourth embodiment as a variant of the third embodiment. In the following, description of portions that are similar to those of the first to third embodiments is omitted.

The second housing is made excessively small in size relative to that of the third embodiment and is installed immediately below the charged particle optical lens barrel 2. FIG. 22 shows a configuration which incorporates a member 150 in which the second housing 121, the diaphragm holding member 47, and the movable member 48 are integrated for miniaturization. The member 150 is arranged at a tip end portion of the charged particle optical lens barrel 2 in such a manner that differential pressure between the vacuum space in the interior of the charged particle optical lens barrel and the space (at the same level as that of the atmospheric pressure) in which the sample is arranged is maintained. The member 150 includes a mechanism that holds the diaphragm 10 and causes the position of the diaphragm 10 to be moved. The mechanism moving the position of the diaphragm 10 is similar to those of the first to third embodiments and includes a joint portion that is engaged with the joint portion of the diaphragm adjusting jig. Concretely, the fastening member 72b that forms a counterpart with respect to the fastening member 72a of the diaphragm adjusting jig 145 is attached to the member 150, and is configured so as to be capable of being mechanically connected to the diaphragm adjusting jig 145. The fastening member 72 is similar to that of the first to third embodiments. In this case, a valve 151 is installed to the vacuum pipe 16, whereby the vacuum-evacuation in the interior of the first housing 7 is switched. By employing such a configuration, the charged particle microscope can be realized which can easily perform the observation under the gas atmosphere in an atmospheric pressure state, in a slightly pressurized state, or in a negative pressure state without the large-scale modification even in the large-sized charged particle microscope.

According to this embodiment, as compared to the devices of the first to third embodiments, the space in which the sample is arranged is made larger, so that the observation of a large-sized sample becomes possible.

Fifth Embodiment

Figure 23:
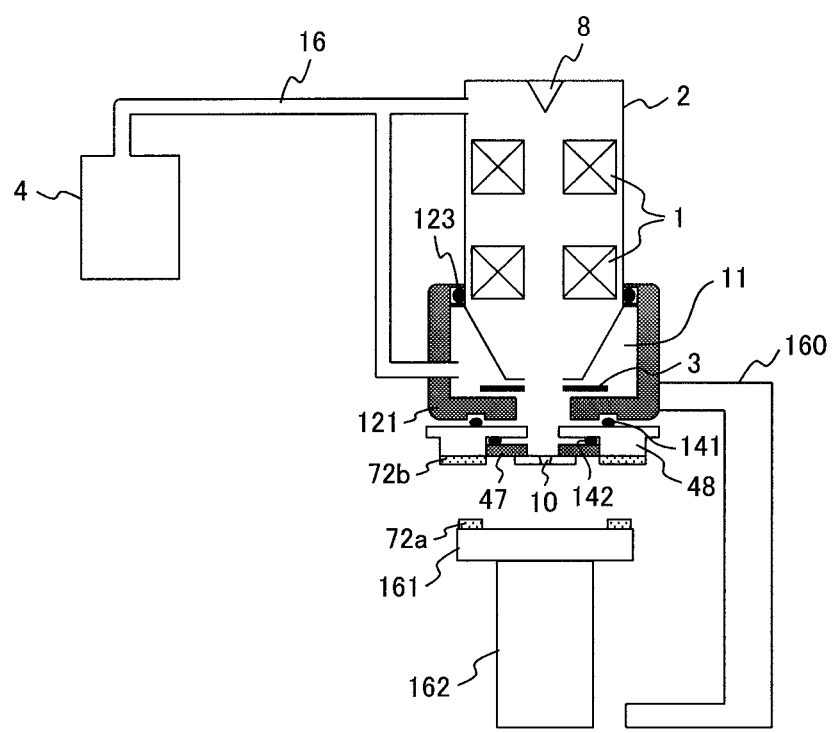
FIG. 23 is an overall configuration view of a charged particle microscope of a fifth embodiment.

FIG. 23 shows a fifth embodiment. In the following, description of portions similar to those of the first to fourth embodiments is omitted.

FIG. 23 shows an entire configuration of a charged particle microscope of this embodiment. This embodiment is different from the third embodiment in that the charged particle optical lens barrel 2 is configured so as to be supported by a column 160, namely, the first housing 7 is replaced with the column 160.

A sample stage 162 that is arranged under the atmosphere is provided at a lower portion of the diaphragm example, by turning an operation portion 204, the sample 6 can be brought near the direction of the diaphragm 10. It should be appreciated that an X-Y drive mechanism moving in 10 provided at the second housing 121. The sample stage 5 has a height adjusting function capable of causing at least the sample 6 to be brought near the diaphragm 10. For an in-plane direction of a sample surface may be provided.

The sample 6 or the adjusting jig 161 is installed on the suitable sample stage 162. Other portions of this embodiment are similar to those of the first to fourth embodiments.

In the case of the configuration of this device, the space in which the sample is arranged is a perfectly atmospheric space, so that even the relatively large sample can be sample-introduced and observed as compared to the aforementioned embodiments.

Incidentally, the present invention is not limited to the aforementioned embodiments, and includes a variety of variations. For example, although the aforementioned embodiments have been described in detail to clearly illustrate the present invention, the present invention need not include all of the structures described in the embodiments. It is possible to replace a part of a structure of an embodiment with a structure of another embodiment. In addition, it is also possible to add, to a structure of an embodiment, a structure of another embodiment. Further, it is also possible to, for a part of a structure of each embodiment, add/remove/substitute a structure of another embodiment. Moreover, the respective structures, functions, processing sections, processing means, etc. which are described above may also be realized with hardware by applying integrated circuit designs to portions or all thereof. Further, the aforementioned respective structures, functions, etc. may also be realized with software by interpretation and execution, by processors, of programs realizing the respective functions.

Information of such programs, tables, and files which realize the respective functions can be recorded in a recording device such as a memory, a hard disk or an SSD (Solid State Drive), or a storage medium such as an ID card, an SD card or an optical disk.

Moreover, the control lines and the information lines which are considered to be required for explanation are shown, and all the control lines and the information lines are not always shown for the product. In fact, almost all configurations may be considered to be connected to one another.

REFERENCE SIGNS LIST

1 ... Optical lens
2 ... Charged particle optical lens barrel
2a ... Charged particle optical lens barrel-optical axis
3 ... Detector
4 ... Vacuum pump
5 ... Sample stage
6 ... Sample
7 ... First housing
8 ... Charged particle source
10 ... Diaphragm
11 ... First space
12 ... Second space
14 ... Leak valve
16 ... Vacuum pipe
18 ... Column
19 ... Plate-member supporting member
20 ... Bottom plate
35 ... Computer
36 ... Upper-level control unit
37 ... Lower-level control unit
43, 44 ... Communication line
47 ... Diaphragm holding member
48 ... Movable member
49a, 49b ... Support member
61 ... an image obtained by a charged particle microscope
70 ... Adjusting jig
70a ... Adjusting-jig handle
71 ... Cover
72a, 72b ... Fastening member
73 ... Pin
74 ... Hole
75 ... Rubber sheet
76 ... Member having concavities, convexities, and protrusions
77 ... Hook
78 ... Loop
80 ... Spring plunger
81 ... Base member
82 ... Hole
83 ... Base member
84 ... Magnet
85 ... Member having concavities and convexities
86 ... Fastening member
100 ... Gas supply pipe
101 ... Gas control valve
102 ... Connection portion
103 ... Gas cylinder
104 ... Pressure adjusting valve
107 ... Support plate
108, 109 ... Operation knob
121 ... Second housing
122, 130 ... Lid member
123, 125, 126 ... Vacuum sealing member
131 ... Main body portion
132 ... Mating portion
141, 142, 143 ... Vacuum sealing member
145 ... Adjusting jig
146 ... Elastic member
150 ... Member
151 ... Valve
160 ... Column
161 ... Adjusting jig
162 ... Sample stage

The invention claimed is:

1. A charged particle beam device comprising:
a charged particle optical lens barrel irradiating a primary charged particle beam onto a sample
a vacuum pump;
a housing forming a part of the charged particle beam device and having an interior adapted to be subjected to vacuum evacuation by the vacuum pump;
a detachable diaphragm separating a space in which the sample is placed in such a manner to maintain pressure in the space at a level larger than pressure in the interior of the housing, and allowing transmission or passage of the primary charged particle beam through the diaphragm;
a sample stage installed in a space on a side opposite to the charged particle optical lens barrel with respect to the diaphragm; and a movable member capable of moving the diaphragm while maintaining the pressure in the space, in which the sample is placed, and the pressure in the interior of the housing, wherein the movable member includes a second joint portion to engage with a first joint portion provided on a diaphragm position adjusting jig adjusting a position on the diaphragm.

2. The charged particle beam device according to claim 1, wherein a force required when the second joint portion is moved in a direction vertical to an optical axis of the charged particle optical lens barrel is set so as to become larger than a force required when the first joint portion is moved in a direction parallel to the optical axis of the charged particle optical lens barrel.

3. The charged particle beam device according to claim 1, wherein one of the first and second joint portions is a pin, and the other of the first and second joint portions is a hole.

4. The charged particle beam device according to claim 1, wherein the first joint portion and the second joint portion are adapted to be engaged with each other with a friction force.

5. The charged particle beam device according to claim 4, wherein one or both of the first and second joint portions are rubber members.

6. The charged particle beam device according to claim 1, wherein one or both of the first and second joint portions have concavities and convexities on a contact surface between the first joint portion and the second joint portion.

7. The charged particle beam device according to claim 1, wherein one or both of the first and second joint portions are planar fasteners provided with hook-shaped members.

8. The charged particle beam device according to claim 1, wherein one of the first and second joint portions is provided with a member drivable in an optical axis direction of the charged particle optical lens barrel, and the other of the first and second joint portions is provided with a hole which can receive the drivable member.

9. The charged particle beam device according to claim 1, wherein one of the first and second joint portions is a spring plunger.

10. The charged particle beam device according to claim 1, wherein the first joint portion and the second joint portion are provided with magnets.

11. The charged particle beam device according to claim 1, wherein one or both of the first and second joint portions comprise a plurality of members whose materials are different from each other.

12. The charged particle beam device according to claim 1, wherein each of the first and second joint portions comprises a plurality of members that exhibit different forces required when the second joint portion is moved in a direction vertical to an optical axis of the charged particle optical lens barrel.

13. The charged particle beam device according to claim 12, wherein an elastic member is provided between the diaphragm position adjusting unit and the sample stage.

14. The charged particle beam device according to claim 1, further comprising a sample stage in which the sample is placed, wherein a diaphragm position adjusting unit provided with the first joint portion is provided at the sample stage.

15. The charged particle beam device according to claim 1, further comprising:
   a first housing forming a part of the charged particle beam device and having an interior adapted to be subjected to vacuum evacuation by the vacuum pump; and
   a second housing fixed to a side face or inner wall surface of the first housing, or the charged particle beam optical lens barrel, and storing the sample in the second housing, wherein
   the diaphragm is provided on an upper surface side of the second housing, and
   pressure in an interior of the second housing is adapted to be maintained in a state of being equal to or larger than pressure in an interior of the first housing.

16. The charged particle beam device according to claim 15, wherein a diaphragm holding member that holds the diaphragm is provided at a ceiling surface of an interior of the second housing.

17. A diaphragm position adjusting method in a charged particle beam device which observes a sample by irradiating a primary charged particle beam onto the sample in a state where a space in which the sample is placed is partitioned in such a manner that pressure in the space, in which the sample is placed, is maintained at a level larger than pressure in an interior of a charged particle optical lens barrel by a detachable diaphragm allowing transmission or passage of the primary charged particle beam through the diaphragm, the position adjusting method comprising the steps of:
   installing an adjusting jig with a first joint portion onto a sample stage movable in an optical axis direction of the charged particle optical lens barrel;
   arranging the adjusting jig immediately below the diaphragm;
   moving the sample stage in the optical axis direction of the charged particle optical lens barrel, to thereby cause the adjusting jig to be engaged with a movable member provided with a second joint portion that is engaged with the first joint portion;
   moving the diaphragm by the movable member in a state where pressure in a space, in which the sample is placed, and pressure in an interior of the housing are maintained, while observing an image that is obtained by irradiation of the primary charged particle beam; and
   moving the sample stage in the optical axis direction of the charged particle optical lens barrel, to thereby separate the adjusting jig from the movable member.

18. A diaphragm adjusting jig used for adjusting a position of a diaphragm in a charged particle beam device that observes a sample by irradiating a primary charged particle beam onto the sample in a state where a space in which the sample is placed is partitioned in such a manner that pressure in the space, in which the sample is placed, is maintained at a level larger than pressure in an interior of a charged particle optical lens barrel by a detachable diaphragm allowing transmission or passage of the primary charged particle beam through the diaphragm, comprising:
   a first joint portion to engage with a second joint portion provided with a movable member included in the charged particle beam device, wherein the movable member can move the diaphragm in a state where pressure in a space, in which the sample is placed, and pressure in the interior of the housing are maintained.

* * * * *